(12) United States Patent
Zheng et al.

(10) Patent No.: US 10,388,680 B2
(45) Date of Patent: Aug. 20, 2019

(54) DISPLAY PANEL AND DISPLAY APPARATUS

(71) Applicant: Xiamen Tianma Micro-Electronics Co., Ltd., Xiamen (CN)

(72) Inventors: Binyi Zheng, Xiamen (CN); Zhuo Deng, Xiamen (CN); Ling Wu, Xiamen (CN); Boping Shen, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

(21) Appl. No.: 15/864,397

(22) Filed: Jan. 8, 2018

(65) Prior Publication Data

US 2018/0151612 A1 May 31, 2018

(30) Foreign Application Priority Data

Sep. 19, 2017 (CN) .......................... 2017 1 0848457

(51) Int. Cl.
*H01L 27/146* (2006.01)
*H01L 27/32* (2006.01)
*G09G 3/36* (2006.01)
*G09G 3/20* (2006.01)

(52) U.S. Cl.
CPC ......... *H01L 27/14603* (2013.01); *G09G 3/20* (2013.01); *G09G 3/3611* (2013.01); *H01L 27/3211* (2013.01); *H01L 27/3213* (2013.01); *G02F 2201/52* (2013.01); *G09G 2310/0232* (2013.01); *G09G 2320/02* (2013.01); *G09G 2320/0285* (2013.01); *G09G 2320/0626* (2013.01)

(58) Field of Classification Search
None
See application file for complete search history.

(56) References Cited

U.S. PATENT DOCUMENTS

2018/0075797 A1\* 3/2018 Park .................... G09G 3/2092

FOREIGN PATENT DOCUMENTS

CN         106530993 A      3/2017

\* cited by examiner

*Primary Examiner* — Zandra V Smith
*Assistant Examiner* — Lawrence C Tynes, Jr.
(74) *Attorney, Agent, or Firm* — Anova Law Group, PLLC

(57) ABSTRACT

A display panel and a display apparatus are provided. The display panel comprises a display region including an irregular-shaped display area, and a non-display region adjacent to the display region. The irregular-shaped display area includes a plurality of pixels arranged in an array. Adjacent pixel rows and/or adjacent pixel columns are indented by at least one pixel at a periphery of the irregular-shaped display area. The at least one indented pixel between the adjacent pixel rows and/or the adjacent pixel columns is a misaligned pixel. The irregular-shaped display area includes a transition area, and the transition area at least includes the misaligned pixel. A maximum display brightness of pixels in the transition area is smaller than a maximum display brightness of pixels outside the transition area.

20 Claims, 18 Drawing Sheets

DISPLAY PANEL AND DISPLAY APPARATUS

CROSS-REFERENCES TO RELATED APPLICATIONS

This application claims the priority of Chinese Patent Application No. 201710848457.1, filed on Sep. 19, 2017, the entire contents of which are incorporated herein by reference.

FIELD OF THE DISCLOSURE

The present disclosure generally relates to the field of display technology and, more particularly, relates to a display panel and a display apparatus.

BACKGROUND

As the display technology advances rapidly, in addition to a traditional information display function, to better adapt to an overall environment and various application scenarios, demands for display panel shapes are gradually increasing. Accordingly, irregular-shaped display panels become available. The irregular-shaped display panel is a display panel that is modified from an existing regular-shaped display panel to achieve a desired shape or a substantially high screen-to-body ratio. Currently, the irregular display panel has been widely used in smart phones, smart watches, smart glasses, smart wristbands, and other similar electronic devices having a display function. The most common shape of the irregular-shaped display panels may include a circular sector, a curved surface, a circle, a side surface of a cylinder, and a polygon, etc.

When a contour of the irregular-shaped display panel is an irregular shape, a plurality of pixels at the edge/border of an existing regular-shaped display panel may be shielded according to the contour shape, such that a contour of an unshielded display region coincides with a pre-determined shape. However, in the existing irregular-shaped display panel, light emitted from pixels at the irregular edge may result a substantial high contrast to the dark non-display region, such that obvious pixel jagging may be perceived by human eyes. Thus, a jagged edge may appear at the irregular edge of the irregular-shaped display panel, the display performance of the irregular-shaped display panel may be degraded, and the user experience may be degraded accordingly.

The disclosed display panel and display apparatus are directed to solve one or more problems set forth above and other problems.

BRIEF SUMMARY OF THE DISCLOSURE

One aspect of the present disclosure provides a display panel, comprising a display region including an irregular-shaped display area, and a non-display region adjacent to the display region. The irregular-shaped display area includes a plurality of pixels arranged in an array. Adjacent pixel rows and/or adjacent pixel columns are indented by at least one pixel at a periphery of the irregular-shaped display area. The at least one indented pixel between the adjacent pixel rows and/or the adjacent pixel columns is a misaligned pixel. The irregular-shaped display area includes a transition area, and the transition area at least includes the misaligned pixel. A maximum display brightness of pixels in the transition area is smaller than a maximum display brightness of pixels outside the transition area.

Another aspect of the present disclosure provides a display apparatus comprising a disclosed display panel.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
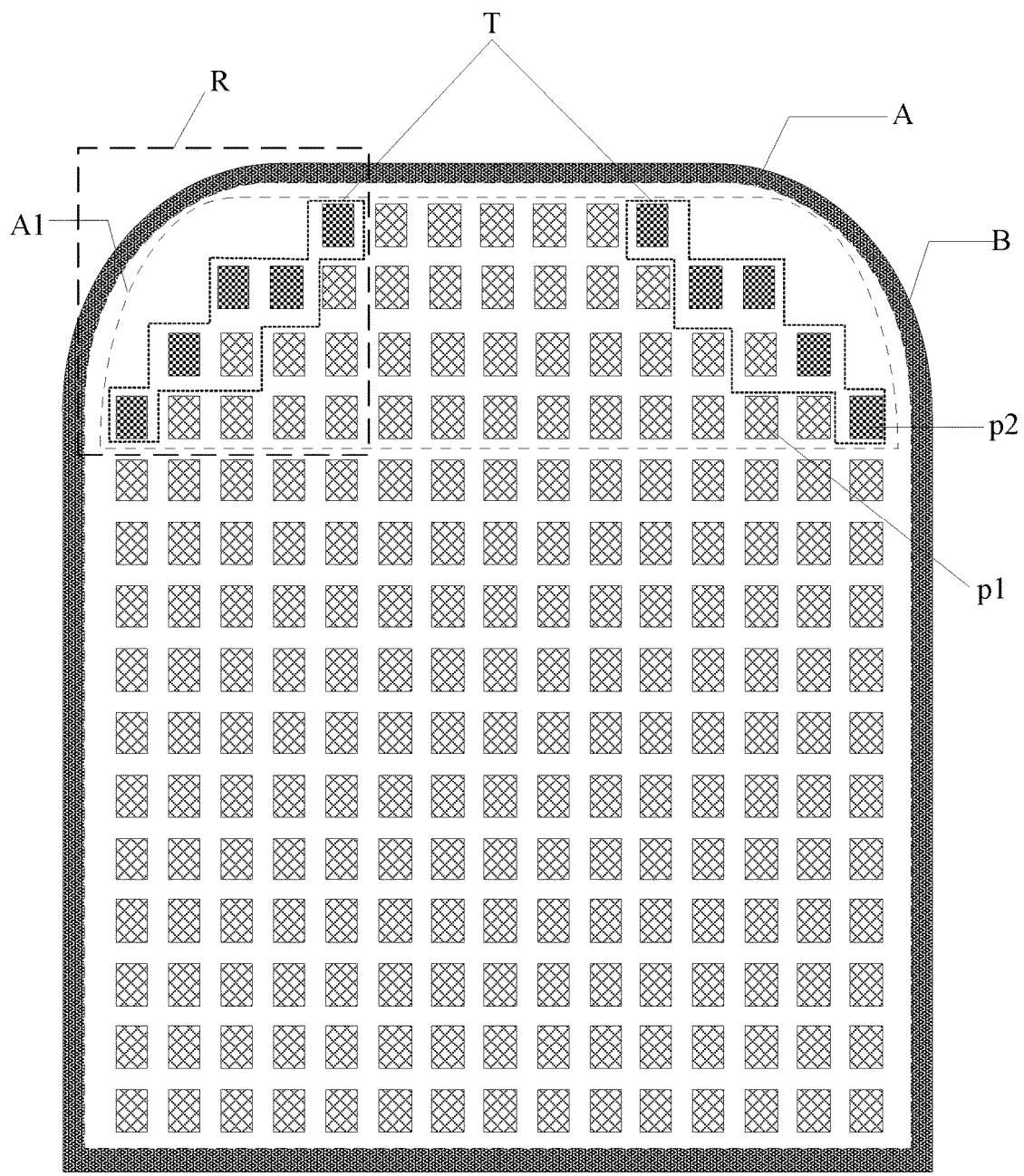
FIG. 1 illustrates a schematic view of an exemplary display panel according to the disclosed embodiments.

The present disclosure provides a display panel and a display apparatus capable of suppressing the jagged edge at the irregular edge of display panel and improving the display performance.

To make the objectives, features, and functions of the present disclosure more comprehensible, the present disclosure will be described with reference to the accompanying drawings and embodiments. However, the exemplary embodiments are presented for illustrative purposes and should not be construed as limitations. On the contrary, the disclosed embodiments are provided so that the present disclosure will be described thoroughly and completely, and will fully convey the concepts and the inventive thinking of the exemplary embodiments to those skilled in the art. The same reference labels and numerals in the drawings denote the same or similar structures, and a repetitive description thereof will be omitted. The expressions and the directions of the present disclosure are described with reference to the accompanying drawings. However, changes may be made if necessary, and all the changes are within the scope of the present disclosure. The drawings are only used for illustrating the relative position relationship, and certain structures may be shown in a disproportional scale for the purpose of comprehension. The dimensions in the drawings do not represent the actual proportional relationship.

It should be understood that the exemplary embodiments described herein are only intended to illustrate and explain the present disclosure and not to limit the present disclosure. In addition, it should also be noted that, for ease of description, only part, but not all, of the structures associated with the present disclosure are shown in the accompanying drawings. Other embodiments obtained by those skilled in the art without making creative work are within the scope of the present disclosure.

Reference will now be made in detail to exemplary embodiments of the disclosure, which are illustrated in the accompanying drawings. Wherever possible, the same reference numbers will be used throughout the drawings to refer to the same or like parts.

FIG. 1 illustrates a schematic view of an exemplary display panel according to the disclosed embodiments. As shown in FIG. 1, the display panel may include a display region A and a non-display region B surrounding the display region A.

The display region A may include an irregular-shaped display area A1. The irregular-shaped display area A1 may include a plurality of pixels p1 arranged in an array. In the irregular-shaped display area A1, adjacent pixel rows and/or adjacent pixel columns may be indented by at least one pixel at irregular edges and the adjacent pixel rows and/or adjacent pixel columns may be indented by an integer number of pixels at the irregular edges. The indented pixels between the adjacent pixel rows, the adjacent pixel columns or both the adjacent pixel rows and adjacent pixel columns may be referred as misaligned pixels p2.

The display panel may be a plasma display panel, a field emission display panel, a light-emitting diode (LED) display panel, an organic light-emitting diode (OLED) display panel, a liquid crystal display panel, a quantum dots (QDs) display panel, an electrophoretic display panel, etc. Further, the display panel may include any appropriate type of display panels capable of display images and/or videos.

In the disclosed embodiments, the display panel may include a color film substrate and an array substrate. A plurality of data lines and a plurality of scanning lines may be configured on the array substrate. The plurality of the data lines and the plurality of the scanning lines may be intersected and insulated with each other. Two adjacent data lines and two adjacent scanning lines may be intersected to define a sub-pixel. A plurality of color resists may be configured on the color film substrate and may be one-to-one corresponding to a plurality of sub-pixels. A plurality of adjacent sub-pixels may be configured to correspond to color resists of different colors. When the plurality of adjacent sub-pixels together emit white light or other color light, the plurality of adjacent sub-pixels may form a pixel.

In one embodiment, as shown in FIG. 1, along a row direction (e.g., the horizontal direction in FIG. 1), three adjacent sub-pixels (not shown) may be configured to emit red light, green light, and blue light, respectively, and the three adjacent sub-pixels may form a pixel. In another embodiment, the pixel may include four sub-pixels, such as a red sub-pixel, a green sub-pixel, a blue sub-pixel, and a white sub-pixel. The four sub-pixels may be arranged in a 1×4 array or a 2×2 array to form the pixel.

In addition, the irregular-shaped display area A1 may include a transition area T configured in periphery of the irregular-shaped display area A1, and the transition area T may at least include the misaligned pixels. A maximum display brightness of the pixels disposed in the transition area T may be smaller than a maximum display brightness of the pixels disposed outside the transition area T. Because one pixel includes a plurality of sub-pixels, in the transition area T, the plurality of the sub-pixels in the same pixel may have an identical maximum display brightness. Similarly, outside the transition area T, the plurality of the sub-pixels in the same pixel may also have an identical maximum display brightness.

In the practical applications, depending on shapes, functions, or structures of the display panel, the display panel may be fabricated as an irregular-shaped structure, which is not a rectangular shape. Thus, the adjacent pixel rows and/or the adjacent pixel columns may include indented or misaligned pixels at irregular edges of the irregular-shaped display area A1 of the display panel. In one embodiment, as shown in FIG. 1, the irregular-shaped display panel may include two round corner regions R in the upper portion of the irregular-shaped display panel. The pixels at the edge of the pixel rows, the pixel columns, or both in the round corner region R of the display region may be indented or misaligned.

In particular, in the round corner region R on the left of FIG. 1, the first pixel row may be indented by two pixels compared to the second pixel row, the second pixel row may be indented by one pixel compared to the third pixel row, and so on. The first to third pixel rows are sequentially arranged along the top-to-bottom direction in FIG. 1, Similarly, in the same round corner region R of FIG. 1, the first pixel column may be indented by one pixel compared to the second pixel column, the second pixel column may be indented by one pixel compared to the third pixel column, and so on. The first to third pixel columns are sequentially arranged along the left-to-right direction in FIG. 1.

In one embodiment, indented pixels between adjacent pixel rows and/or between adjacent pixel columns may be referred as misaligned pixels. The misaligned pixel may only refer to a pixel rather than a sub-pixel. Because the misaligned pixels are often present at the edges of the display panel, the pixel configuration at the edges may appear jagged. When the display panel is displaying an image, the non-display region may be substantially dark, and the display region may be substantially bright as compared to the non-display region. Consequently, the displayed image may have a substantially high contrast ratio. When human eyes are viewing the periphery of the display panel, due to the substantial contrast ratio between the misaligned pixels and the non-display region, the edges of the display panel may appear jagged, and the display performance may be significantly degraded.

In the disclosed display panels, a transition area T including at least the misaligned pixels p2 may be configured. A maximum display brightness of the pixels in the transition area T may be smaller than a maximum display brightness of the pixels outside the transition area T. As a result, the contrast ratio between the misaligned pixels at the irregular edges and the adjacent non-display region may be reduced, the display brightness perceived by human eyes may be gradually reduced from the normal display area to the irregular edges to the non-display region, and the visual perception of the jagged edges may be suppressed. Thus, the jagged effect at the edges of the display panel may be suppressed, and the viewing experience may be improved.

Figure 2A:
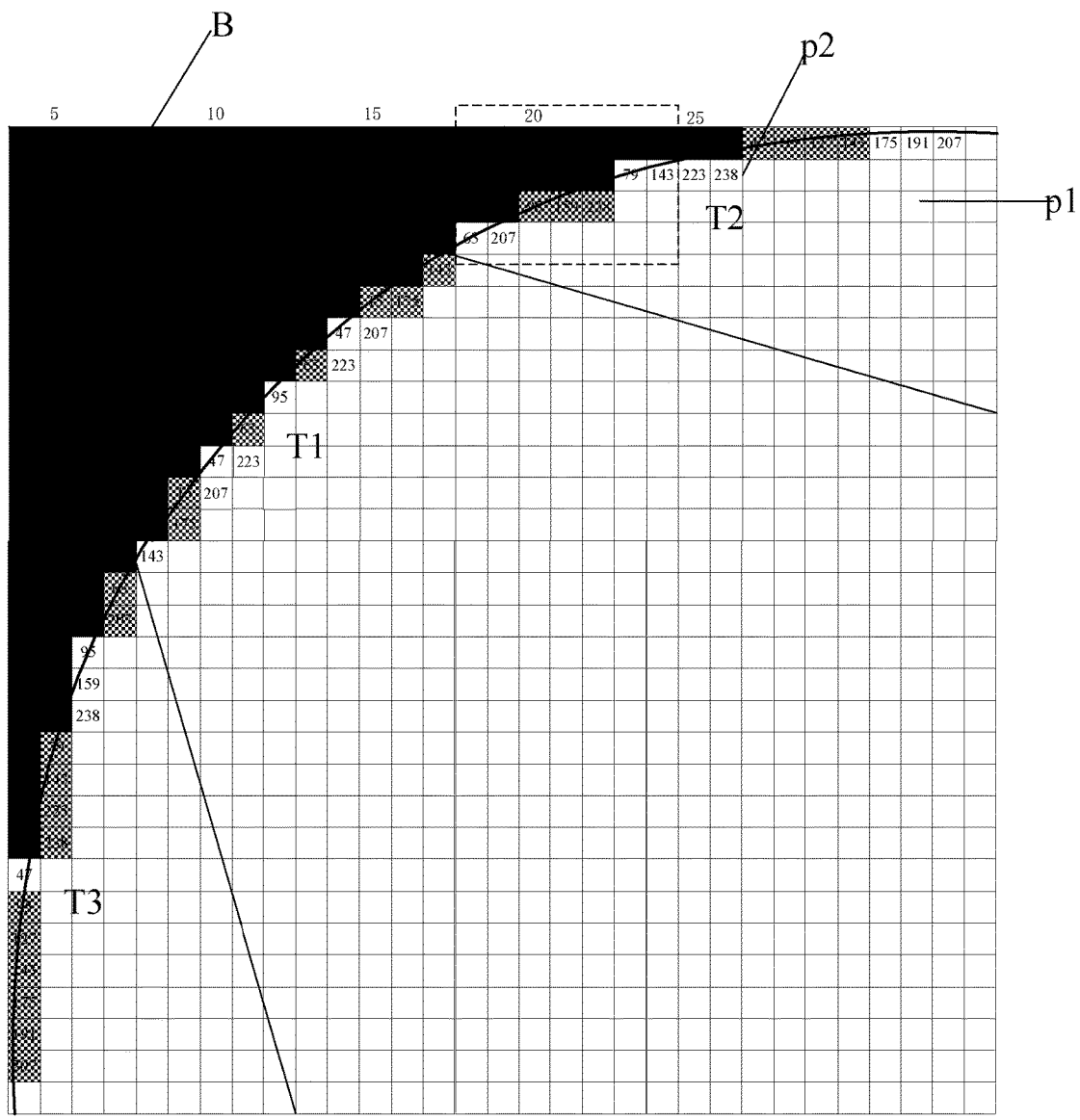
FIG. 2A illustrates a partially enlarged view of a round corner R in FIG. 1.

FIG. 2A illustrates a partially enlarged view of a round corner R in FIG. 1. As shown in FIG. 2A, a transitional effect of the maximum display brightness of the pixels in the transition area T may be observed. For illustrative purposes, the pixels may be consecutively arranged, and each pixel may be represented by a square. The non-display region B may be indicated by the black color. When driven under the normal condition, each pixel may reach a maximum display brightness A. For illustrative purposes, 256 grayscales may be used to represent different display brightness levels. Each pixel may be configured to have any one of the 256 display brightness levels. The 256 grayscale numbers may be denoted between 0 and 255. The grayscale 255 may correspond to the maximum display brightness A (because the grayscale number starts from 0, the display brightness level may be the grayscale number plus 1.)

As shown in FIG. 2A, the grayish squares may represent pixels having a reduced maximum display brightness, which is smaller than the maximum display brightness A. The numbers marked in the pixel squares may be the grayscale numbers or a ratio of the actual pixel display brightness to the maximum display brightness A. For example, the number 95 marked in one pixel square may indicate the maximum display brightness for the pixel is the grayscale 95, and, accordingly the display brightness may be 96 A/256. The number 143 marked in another pixel square may indicate the maximum display brightness for the pixel is the grayscale 143 and, accordingly the display brightness may be 144 A/256, and so on. In the disclosed embodiments, the number (grayscale number) marked in the pixel square may represent the actual display brightness of the pixel. As shown in FIG. 2A, the white squares may denote the pixels having the maximum display brightness A. The curved line may represent an ideal round corner in the periphery of the display region.

Figure 2B:
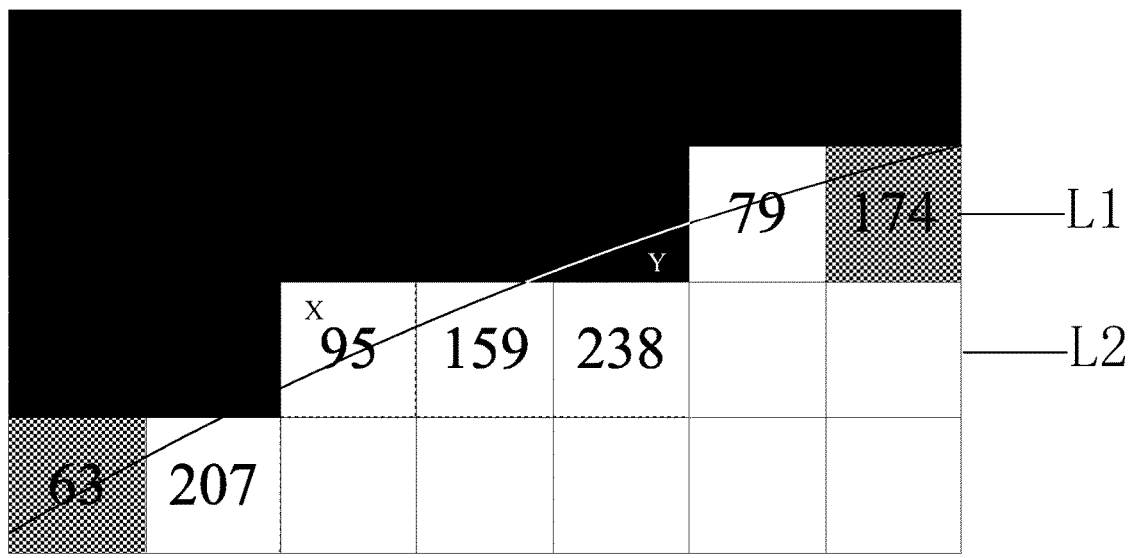
FIG. 2B illustrates an enlarged view of exemplary pixels enclosed by dashed lines in a rectangular area in FIG. 2A.

FIG. 2B illustrates an enlarged view of pixels enclosed by dashed lines in a rectangular area in FIG. 2A. As shown in FIG. 2B, a curved line may have a first side adjacent to the display region and a second side far away from the display region. Under ideal circumstances, pixels on the first side of the curved line may appear bright, and the second side of the curved line may appear dark. In the practical application scenarios, because the pixel is rectangular-shaped, when the ideal curved line intersects the pixel, the entire pixel may still exhibit a uniform brightness on both the first side and the second side of the curved line, i.e., the entire pixel may be unable to be separated into different regions with different display brightness. Thus, a bright portion X of the pixel may exhibit on the second side of the curved line, and a dark portion Y may exhibit on the first side of the curved line, thereby causing the jagged effect at the round corner.

In one embodiment, in the periphery of the round corner region, because the bright portion X of the pixel is on the second side of the curved line, to visually reduce the display brightness of the bright portion X, the maximum display brightness of the pixel may be reduced to the grayscale 95 (from the original display brightness A). Similarly, the adjacent pixel at the right side of the pixel having the bright portion X may also exhibit brightness on the second side of the curved line and, accordingly, the maximum display brightness of the adjacent pixel may be reduced to the grayscale 159. As a comparison, the dark portion Y may be on the first side of the curved line. To visually increase the brightness of the dark portion Y, the display brightness of the adjacent pixel immediately below the dark portion Y may be configured to be the grayscale 238. When the adjacent pixels in the pixel row include bright portions X, the display brightness may be configured in proportional to a ratio of the bright portion X area over the total pixel area.

As shown in FIG. 2B, in the second pixel row L2 (along the top-to-bottom direction in FIG. 2B, along the left-to-right direction in FIG. 2B), the ratio of the bright portion area of the first pixel to the total area of the first pixel may be greater than the ratio of the bright portion area of the second pixel to the total area of the second pixel. Thus, the display brightness of the first pixel may be configured to be smaller than the display brightness of the second pixel. As a result, the maximum display brightness of the pixels in the same pixel row may gradually increase in a direction moving away from the non-display region. Similarly, the maximum display brightness of the pixels in the same pixel column may gradually increase in a direction moving away from the non-display region.

In one embodiment, the pixels in the transition area T may be the pixels of which the maximum display brightness may gradually change. Thus, in the transition area T, the maximum display brightness of the pixels in the same pixel row may gradually increase in the direction moving away from the non-display region. Similarly, in the transition area T, the maximum display brightness of the pixels in the same pixel column may gradually increase in the direction moving away from the non-display region. Accordingly, the bright portions and the dark portions of the pixels in the periphery region may be both compensated, such that the display brightness of the misaligned pixels in the periphery of the display region may have a visually perceivable transition, and the jagged effect in the periphery region may be suppressed.

In the disclosed embodiments, as shown in FIG. 2A, the number of misaligned pixels in each pixel row or each pixel column may be different. When the number of the misaligned pixels in the pixel row or the pixel column is large, more display brightness levels may be configured for the display brightness transition to avoid unnatural display effects which are caused by the abrupt display brightness changes. In one embodiment, the transition area T may include a first transition sub-area T1, a second transition sub-area T2, and a third transition sub-area T3.

In the first transition sub-area T1, the number of the misaligned pixels p2 in the pixel row direction or the pixel column direction may be two or less. In the second transition sub-area T2, the number of the misaligned pixels p2 in the pixel row direction or the pixel column direction may be two or more. In the third transition sub-area T3, the number of the misaligned pixels p2 in the pixel row direction or the pixel column direction may be two or more. Further, the second transition sub-area T2 and the third transition sub-area T3 may only include the misaligned pixels p2. The first transition sub-area T1 may include the misaligned pixels p2 and the adjacent pixel p1 in the same pixel row or the same pixel column as the misaligned pixels p2.

In the second transition sub-area T2 and the third transition sub-area T3, the number of the misaligned pixels p2 in every pixel row and/or every pixel column may be at least two. Thus, the misaligned pixels p2 in each pixel row and/or each pixel column may be enough for realizing the display brightness transition. However, in the first transition sub-area T1, the number of the misaligned pixels p2 in every pixel row and/or every pixel column may be at most two. That is, some pixel rows and/or some pixel columns may include only one misaligned pixel p2. When only one misaligned pixel p2 is configured for the display brightness transition, the abrupt display brightness difference between the misaligned pixel p2 and the adjacent pixel p1 may cause unnatural display effect. Thus, in the first transition sub-area T1, the misaligned pixels p2 and the adjacent pixel p1 in the same pixel row or the same pixel column of the misaligned pixels p2 may be configured for the display brightness transition to avoid unnatural display effect.

In one embodiment, as shown in FIG. 2B, the second transition sub-area T2 may include at least a first pixel row L1 and a second pixel row L2. The first pixel row L1 may include a smaller number of the misaligned pixels p2 than the second pixel row L2. The maximum display brightness difference between any two adjacent misaligned pixels p2 in the first pixel row L1 may be larger than the maximum display brightness difference between any two adjacent misaligned pixels p2 in the second pixel row L2.

For example, as shown in FIG. 2B, the first pixel row L1 may include two misaligned pixels p2 and the second pixel row L2 may include three misaligned pixels p2. The maximum display brightness difference between the two adjacent misaligned pixels p2 in the first pixel row L1 may be 174−79=95. The maximum display brightness difference between any two adjacent misaligned pixels p2 in the second pixel row L2 may be 159−95=64 and 238-159=79.

The misaligned pixels p2 may be disposed on the periphery side of the pixel row adjacent to the non-display region. To facilitate a bright-to-dark display brightness transition from the display region to the non-display region, compared to the pixel row including a smaller number of the misaligned pixels p2, in the pixel row including a larger number of misaligned pixels p2, a substantially smooth display brightness transition may be configured between adjacent misaligned pixels p2 to allow a substantially natural display effect.

In one embodiment, for the convenience of determining the maximum display brightness for the misaligned pixel, the maximum display brightness difference between any two adjacent misaligned pixels may be configured equally in the second pixel row, i.e., the pixel row including three or more misaligned pixels p2. That is, the maximum display brightness of the misaligned pixels p2 in the same pixel row may be configured to decrease in an equally distributed difference in the direction moving toward the non-display region.

Similarly, the third transition sub-area T3 may at least include a first pixel column and a second pixel column. The first pixel column may include a smaller number of the misaligned pixels p2 than the second pixel column. The first pixel column may have a larger maximum display brightness difference between two adjacent misaligned pixels p2 than the second pixel column. In one embodiment, for the convenience of determining the maximum display brightness for the misaligned pixel, the maximum display brightness difference between any two adjacent misaligned pixels may be configured equally in the second pixel column. The maximum display brightness of the misaligned pixels in the pixel row in the third transition sub-area T3 and the maximum display brightness of the misaligned pixels in the pixel column in the second transition sub-area T2 may be configured in the same way, and will not be described repeatedly.

In certain other embodiments, a substantially large transition area may be configured to achieve a substantially smooth transition in the periphery area. For example, the first transition sub-area T1 may include at least three pixels configured for the maximum display brightness transition in the row direction and/or the column direction, and the maximum display brightness difference between any two adjacent pixels configured for the maximum display brightness transition may be configured equally.

Figure 3:
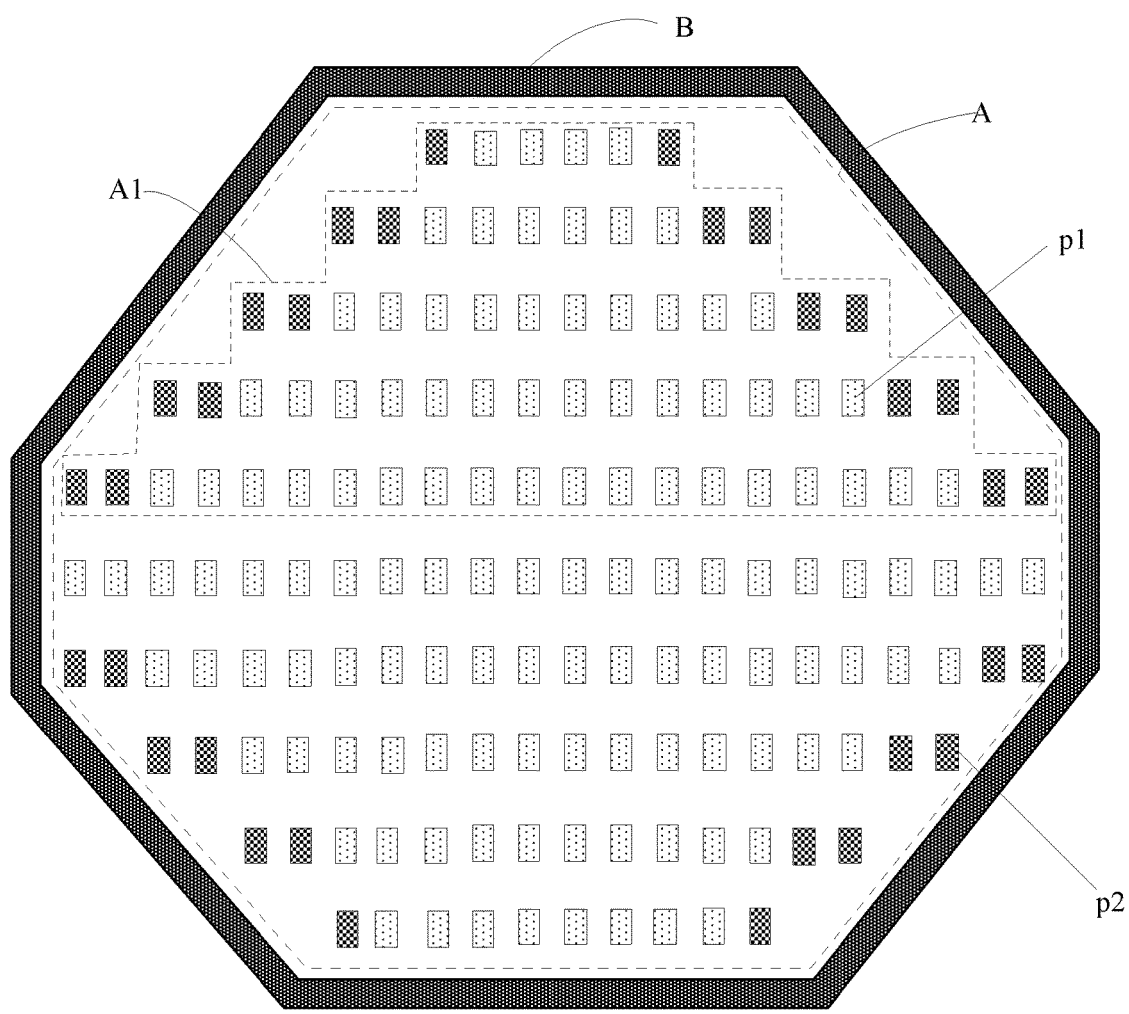
FIG. 3 illustrates a schematic view of another exemplary display panel according to the disclosed embodiments.

FIG. 3 illustrates a schematic view of another exemplary display panel according to the disclosed embodiments. In one embodiment, as shown in FIG. 3, the display panel may include a display region A and a non-display region B, both having an identical polygon shape. The contour of a portion of the edge of an irregular-shaped display area A1 may include a plurality of straight-line sections (e.g., the straight-line sections on the right side and the left side of the display area A1 in FIG. 3) that are parallel to neither the pixel row direction nor the pixel column direction. The number of the misaligned pixels p2 between any two adjacent pixel rows may be configured to equal and/or the number of the misaligned pixels p2 between any two adjacent pixel columns may be configured to equal.

In particular, the irregular-shaped display area A1 may include straight-line sections that form an angle greater than, equal to or smaller than about 45° with respect to the horizontal direction, provided that any two adjacent pixel rows include a same number of the misaligned pixels p2 and/or any two adjacent pixel columns include a same number of the misaligned pixels p2. FIGS. 4A-4D illustrate schematic views of various exemplary pixel configurations according to the disclosed embodiments.

Figure 4A:
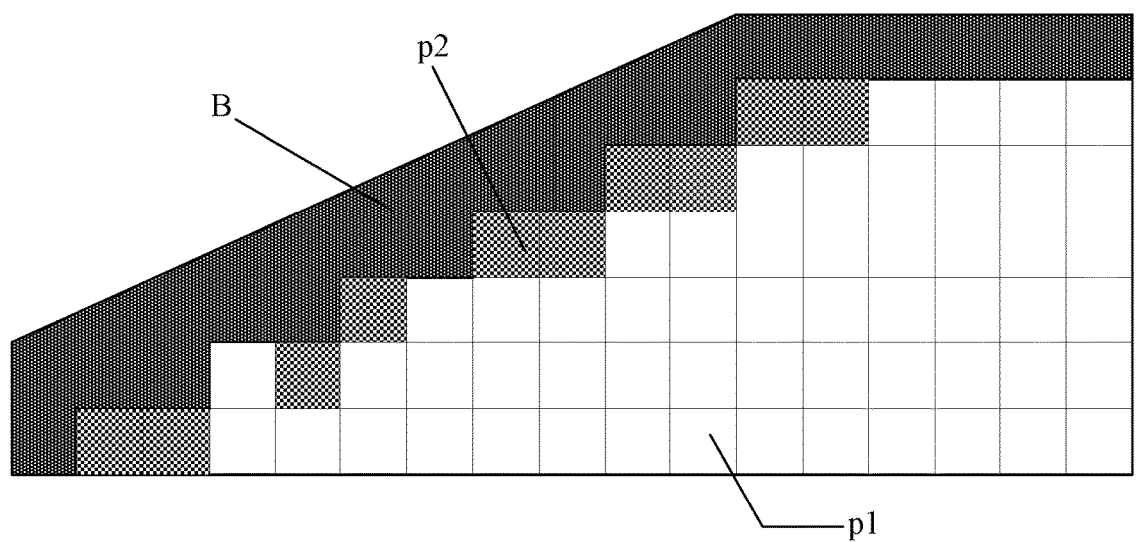
FIG. 4A illustrates a schematic view of an exemplary pixel configuration in an exemplary irregular-shaped display area according to the disclosed embodiments.

In one embodiment, as shown in FIG. 4A, in the periphery area of the display region adjacent to the non-display region B, any two adjacent pixel rows may be indented by two misaligned pixels p2. Two adjacent pixel columns may be grouped together to form a pixel column group, and may include equal number of pixels. Any two adjacent pixel column groups may be indented by one misaligned pixel p2. Thus, the contour of the misaligned pixels p2 may form a straight-line section having a smaller than about 45° angle with respect to the horizontal direction.

Figure 4B:
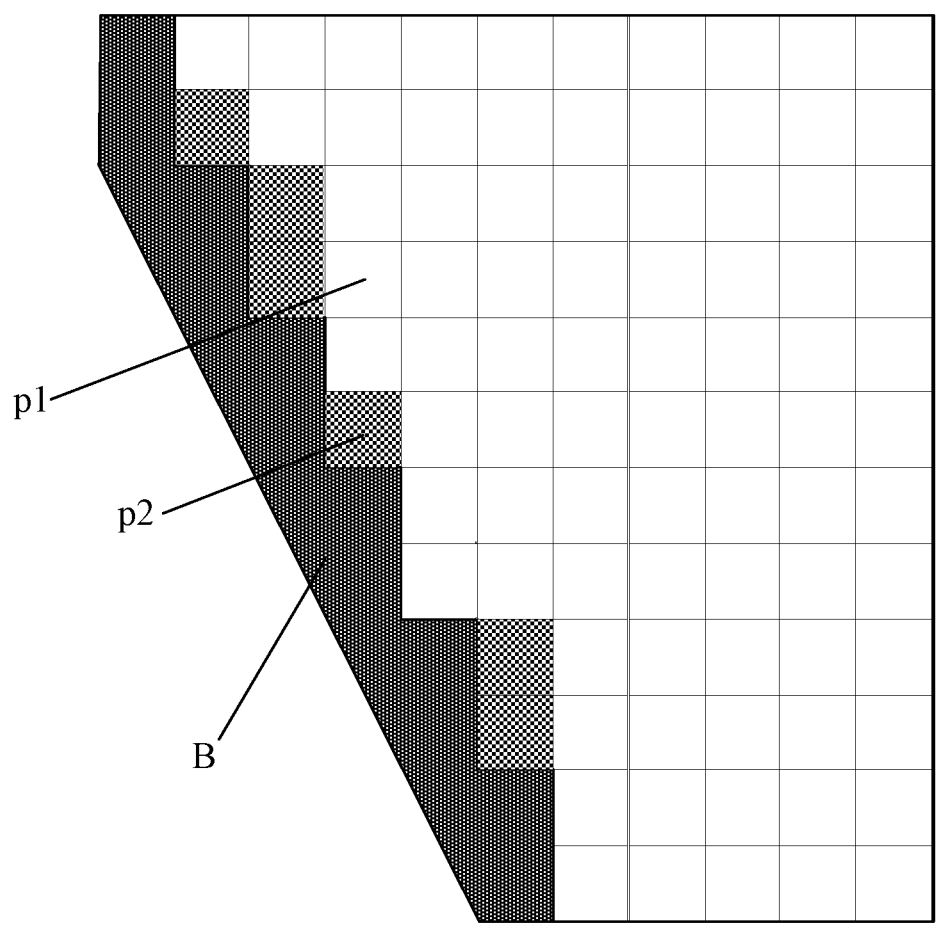
FIG. 4B illustrates a schematic view of another exemplary pixel configuration in an exemplary irregular-shaped display area according to the disclosed embodiments.

In another embodiment, as shown in FIG. 4B, in the periphery area of the display region adjacent to the non-display region B, any two adjacent pixel columns may be indented by two misaligned pixels p2. Two adjacent pixel rows may be grouped together to form a pixel row group, and may include equal number of pixels. Any two adjacent pixel row groups may be indented by one misaligned pixel p2. Thus, the contour of the misaligned pixels p2 may form a straight-line section having a greater than about 45° angle with respect to the horizontal direction.

Figure 4C:
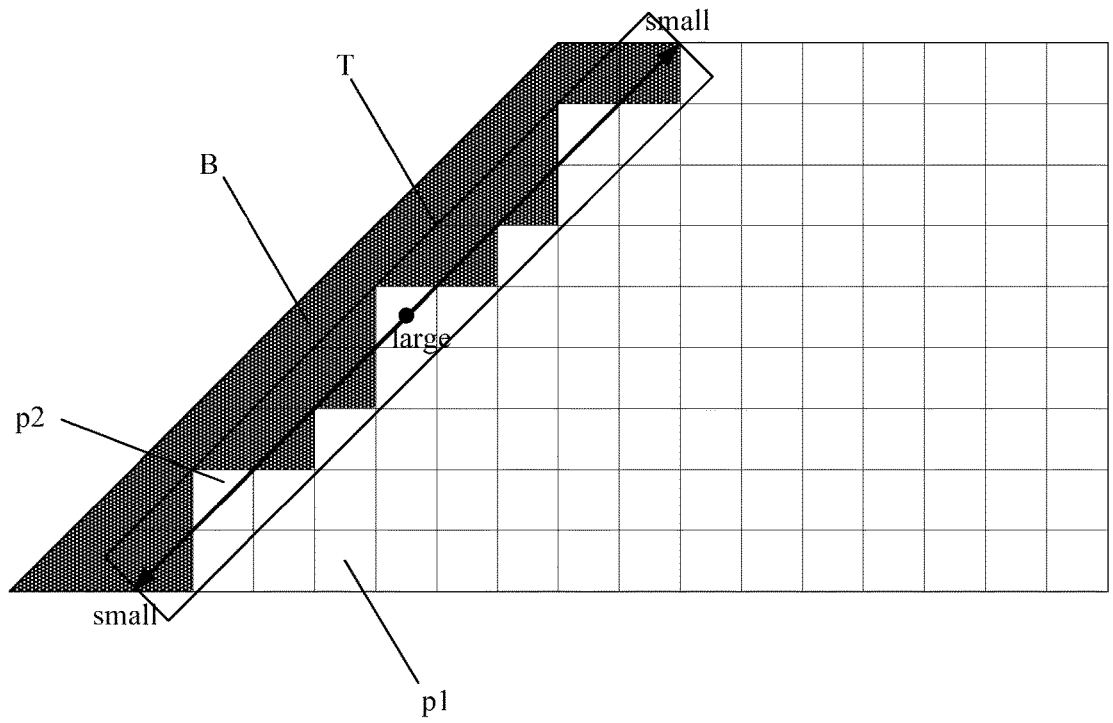
FIG. 4C illustrates a schematic view of another exemplary pixel configuration in an exemplary irregular-shaped display area according to the disclosed embodiments.
Figure 4D:
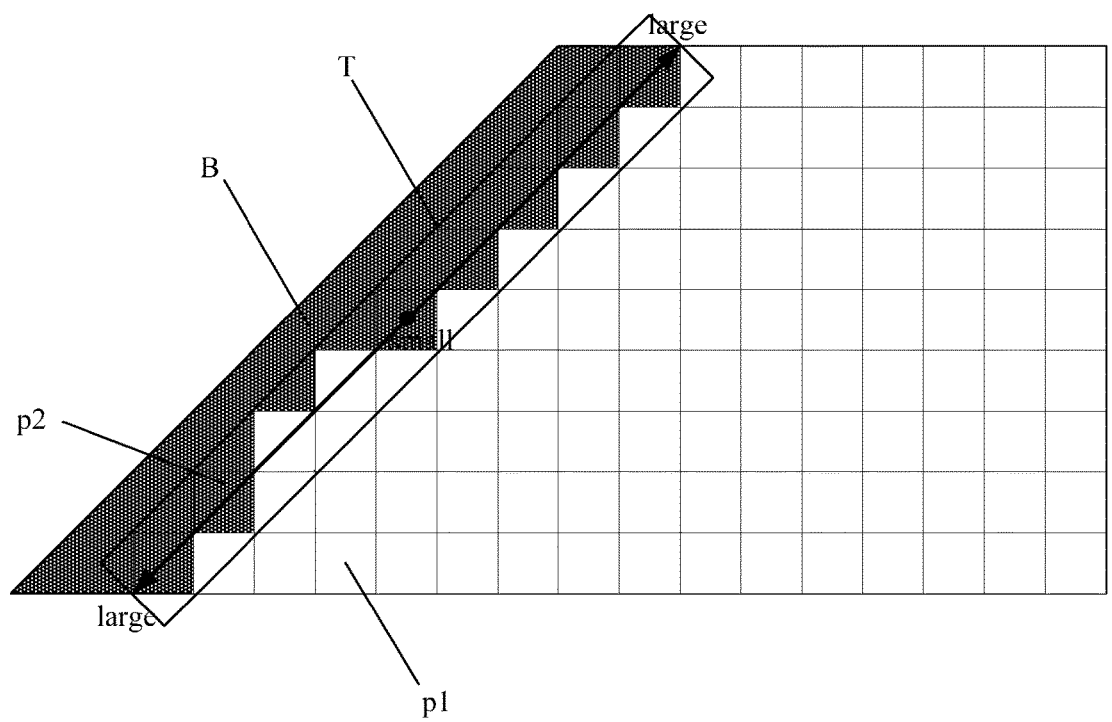
FIG. 4D illustrates a schematic view of another exemplary pixel configuration in an exemplary irregular-shaped display area according to the disclosed embodiments.

In certain other embodiments, as shown in FIG. 4C and FIG. 4D, in the periphery area of the display region adjacent to the non-display region B, any two adjacent pixel rows may be indented by one misaligned pixels p2, and any two adjacent pixel columns may be indented by one misaligned pixel p2. Thus, the contour of the misaligned pixels p2 may form a straight-line section having an about 45° angle with respect to the horizontal direction.

In the practical application scenarios, the number of the indented misaligned pixels p2 between any two adjacent pixel rows and/or between any two adjacent pixel columns may be increased or decreased to adjust the angle formed by the straight-line section of the contour of the misaligned pixels p2 with respect to the horizontal direction. The pixel configurations shown in FIGS. 4A-4D are for illustrative purposes and are not intended to limit the scope of the present disclosure.

When the edge of the irregular-shaped display area forms a straight-line section having an about 45° angle with respect to the horizontal direction, N number of the adjacent pixel rows may be grouped together to form a pixel row group, N number of the adjacent pixel columns may be grouped together to form a pixel column group, and any two adjacent pixel row groups and any two adjacent pixel column groups may be indented by N number of the misaligned pixels, respectively, where N is an integer greater than or equal to 2. In this case, the jagged effect at the periphery of the display region may appear substantially obvious. Thus, in the practical application scenarios, the pixel configurations shown in FIG. 4C and FIG. 4D may be used to configure the edge of the irregular-shaped display area to form a straight-line section having an about 45° angle with respect to the horizontal direction.

In one embodiment, in the transition area T as shown in FIG. 4C and FIG. 4D, any two adjacent pixel rows may be misaligned by one misaligned pixel p2, and any two adjacent pixel columns may be misaligned by one misaligned pixel p2. The contour of the misaligned pixels p2 in the transition area T may form a straight-line section. When the pixels at the jagged edge exhibit equal display brightness, the jagged effect perceived at the edge may appear substantially obvious. To suppress the jagged effect caused by the misaligned pixels at the edge, the maximum display brightness of the misaligned pixels that form the straight-line section at the edge may be configured to facilitate a smooth transition. Thus, the jagged effect perceived by human eyes at the edge may be suppressed.

In one embodiment, as shown in FIG. 4C, the maximum display brightness of the misaligned pixels p2 that form the straight-line section may gradually decrease from the center point of the straight-line section to both ends of the straight-line section. As shown in FIG. 4C, the maximum display brightness at the center point of the straight-line section may be greater than the maximum display brightness at both ends of the straight-line section. Thus, the maximum display brightness of the misaligned pixels p2 may gradually transition along the straight-line section to suppress the jagged effect perceived by human eyes and to improve the user experience.

When a substantially high display brightness image is viewed by human eyes, the perception of the jagged effect may appear substantially obvious. Thus, in one embodiment, the maximum display brightness of the misaligned pixel located at the center point may be configured to be approximately in the range of the grayscale 48 A/256 to the grayscale 149 A/256, where A is the maximum display brightness of the pixels in the normal display area of the display region. The maximum display brightness of the misaligned pixels p2 may be configured to be in the low to medium display brightness range as compared to the maximum display brightness of the pixels disposed in the normal display area to suppress the jagged effect perceived by human eyes and to improve the user experience.

In one embodiment, as shown in FIG. 4D, the maximum display brightness of the misaligned pixels p2 that form the straight-line section may gradually increase from the center point of the straight-line section to both ends of the straight-line section. As shown in FIG. 4D, the maximum display brightness at the center point of the straight-line section may be smaller than the maximum display brightness at both ends of the straight-line section. Thus, the maximum display brightness of the misaligned pixels p2 may gradually transition along the straight-line section to suppress the jagged effect perceived by human eyes and to improve the user experience.

When a substantially high display brightness image is viewed by human eyes, the perception of the jagged effect may appear substantially obvious. Thus, in one embodiment, the maximum display brightness of the misaligned pixel located at the center point may be configured to be approximately in the range of the grayscale 88 A/256 to the grayscale 166 A/256, where A is the maximum display brightness of pixels in the normal display area of the display region. The maximum display brightness of the misaligned pixels p2 may be configured to be in the low to medium display brightness range as compared to maximum display brightness of the pixel disposed in the normal display area to suppress the jagged effect perceived by human eyes and to improve the user experience.

Figure 4E:
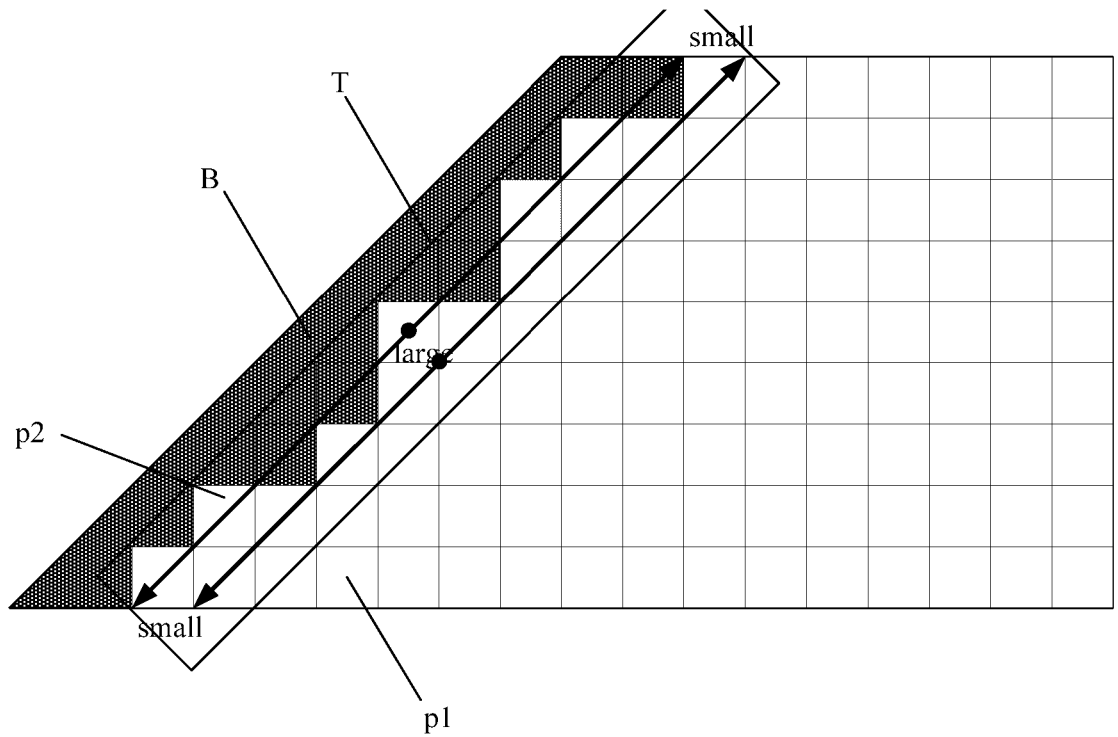
FIG. 4E illustrates a schematic view of another exemplary pixel configuration in an exemplary irregular-shaped display area according to the disclosed embodiments.
Figure 4F:
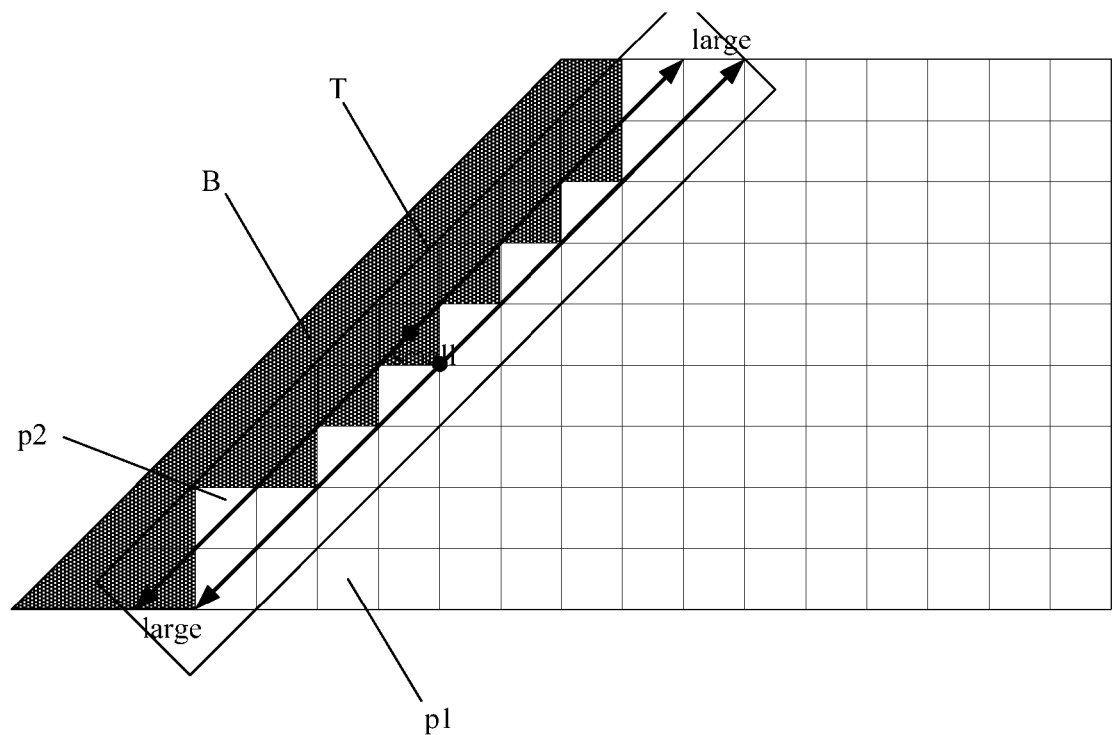
FIG. 4F illustrates a schematic view of another exemplary pixel configuration in an exemplary irregular-shaped display area according to the disclosed embodiments.

To configure a substantially smooth transition of the maximum display brightness at the irregular edge, the transition area T may be expanded. FIG. 4E illustrates a schematic view of another exemplary pixel configuration in an exemplary irregular-shaped display area according to the disclosed embodiments. FIG. 4F illustrates a schematic view of another exemplary pixel configuration in an exemplary irregular-shaped display area according to the disclosed embodiments. As shown in FIG. 4E and FIG. 4F, the contour of the misaligned pixels p2 may form a straight-line section. In one embodiment, the pixels p1 adjacent to the misaligned pixels p2 may be included in the transition area T, and the pixels p1 included in the transition area T may form another straight-line section, parallel to the straight-line section formed by the misaligned pixels p2, as shown in FIG. 4E.

In one embodiment, as shown in FIG. 4E, the maximum display brightness of the pixels on both straight-line sections may gradually decrease from the center point of the straight-line section to both ends of the straight-line section. At the same time, the average display brightness of the misaligned pixels p2 that form the straight-line section at the edge of the irregular-shaped display area may be smaller than the average display brightness of the pixels p1 that form the adjacent straight-line section. Thus, the display brightness may transition from bright to dark in a direction from the normal display area to the irregular edge to further suppress the jagged effect at the edge. Moreover, the pixel row and/or the pixel column may include two pixels in the transition area T, and the maximum display brightness of the two pixels may gradually increase in a direction facing far away from the non-display region.

In one embodiment, as shown in FIG. 4F, the maximum display brightness of the pixels on both straight-line sections may gradually increase from the center point of the straight-line section to both ends of the straight-line section. At the same time, the average display brightness of the misaligned pixels p2 that form the straight-line section at the edge of the irregular-shaped display area may be smaller than the average display brightness of the pixels p1 that form the adjacent straight-line section. Thus, the display brightness may transition from bright to dark in the direction from the normal display area to the irregular edge to further suppress the jagged effect at the edge.

Figure 5:
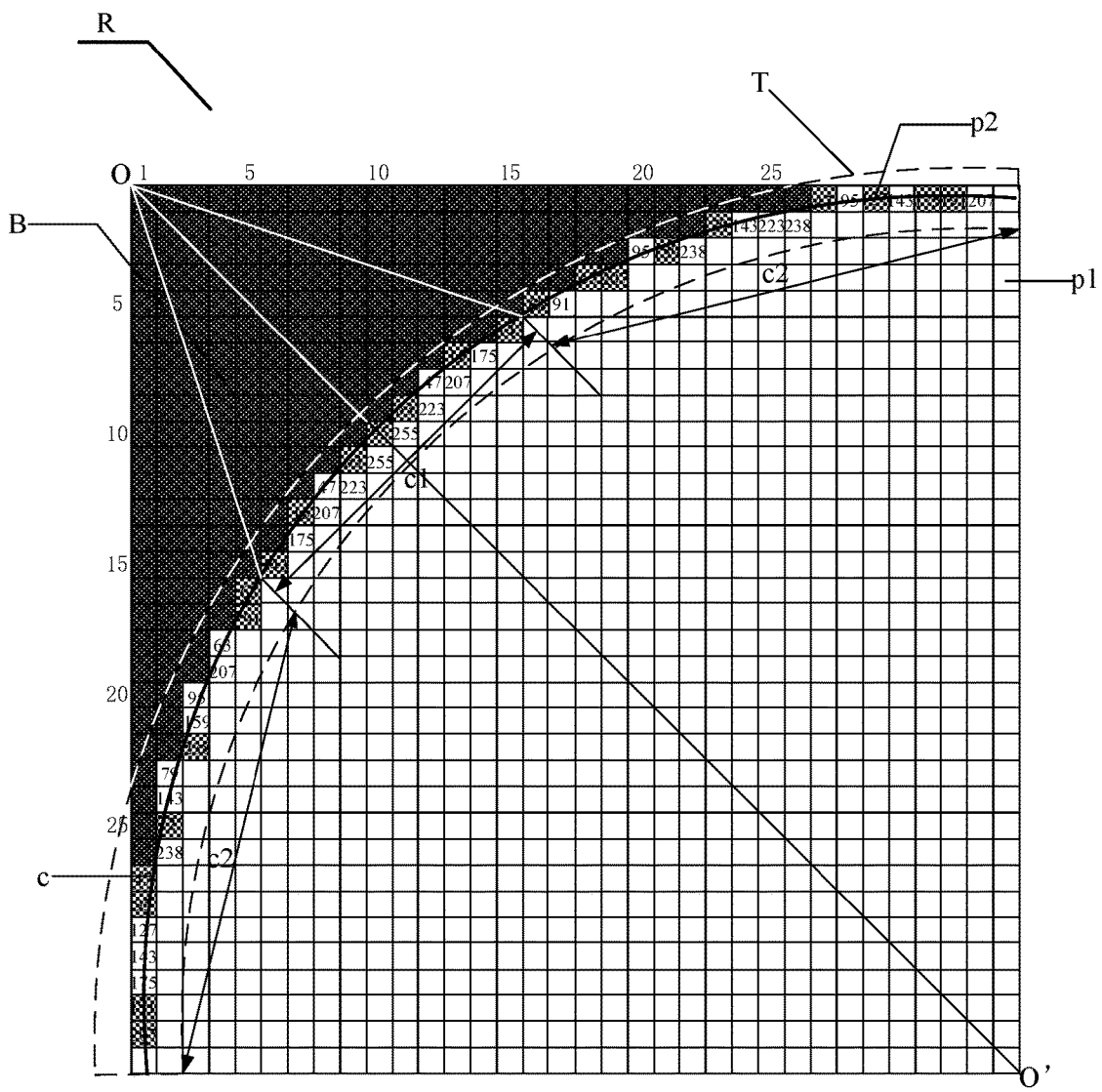
FIG. 5 illustrates a partially enlarged view of a round corner R in FIG. 1.

In one embodiment, the display panel may have a shape as shown in FIG. 1. The contour of a portion of the edge of the irregular-shaped display area A1 may be an arc that protrudes toward the non-display region B, i.e., the round corner region R. FIG. 5 illustrates a partially enlarged view of a round corner R in FIG. 1. As shown in FIG. 5, the black portion may represent the non-display region B, the grayish pixel squares may represent the misaligned pixels p2, and the white pixel squares without numbers may represent the pixels p1 having the maximum display brightness A. The number marked in the pixel square may represent the grayscale number (e.g., 256 grayscale levels, denoted by 0 to 255, where grayscale 255 corresponds to the display brightness A) corresponding to the maximum display brightness of the pixel indicated by the pixel square. For example, the number 95 marked in the pixel square may represent the display brightness of the pixel in the grayscale 95, which corresponds to the maximum display brightness 96 A/256. The number 143 marked in the pixel square may represent the display brightness of the pixel in the grayscale 143, which corresponds to the maximum display brightness 144 A/256. And so on so forth. In the disclosed embodiments, the number marked in the pixel square may represent the maximum display brightness of the pixel (i.e., the grayscale number).

In one embodiment, as shown in FIG. 5, the contour of the irregular-shaped display area A1 may be an arc c. The arc c may be a symmetrical shape in the transition area T (with respect to the symmetry axis OO'). The arc c may include one center portion c1 and two side portions c2. The center portion c1 may be disposed between the two side portions c2. The center portion c1 may be symmetrical with respect to the symmetry axis OO'. Further, any two adjacent pixel rows or any two adjacent pixel columns corresponding to the center portion c1 may be misaligned by two or less misaligned pixels p2. The maximum display brightness of the misaligned pixels p2 arranged along the center portion c1 of the arc c may gradually decrease when moving away from the symmetry axis OO'.

As shown in FIG. 5, in the transition area T corresponding to the center portion c1, the maximum display brightness of the outer side misaligned pixels p2 adjacent to the non-display region B may gradually decrease when moving away from the symmetry axis OO'. The grayscale number corresponding to the maximum display brightness of the misaligned pixel intersecting the symmetry axis OO' may be 95. The grayscale numbers corresponding to the maximum display brightness of the misaligned pixels p2 moving away from the center pixel may be 63, 47, and 15, respectively. The maximum display brightness of the inner side misaligned pixels p2 adjacent to the outer side misaligned pixels may be configured in the same way. For example, the grayscale numbers corresponding to the maximum display brightness of the two pixels closest to the symmetry axis OO' may be 255. When moving away from the symmetry axis OO', the grayscale numbers corresponding to the maximum display brightness of the pixels may be 223, 207, 175, and 143, respectively. The maximum display brightness of the inner side pixels may be greater than the maximum display brightness of the corresponding outer side pixels.

The pixels corresponding to the center portion c1 may often be the misaligned pixels between the adjacent pixel rows and between the adjacent pixel columns. Human eyes may be sensitive to the difference between the display brightness of the misaligned pixels arranged in a staircase shaped at the arc edge and the display brightness of the non-display region B. In one embodiment, to suppress the jagged effect at the arc edge, and in the meantime, to facilitate the overall trend that the maximum display brightness of the pixels in the pixel row and the pixel column may gradually increase in the direction moving away from the non-display region B, the maximum display brightness of the pixels in the center portion c1 may gradually decrease from the center to both sides. Thus, the jagged effect at the edge may be suppressed, and the displaying effect may be more natural.

Figure 6:
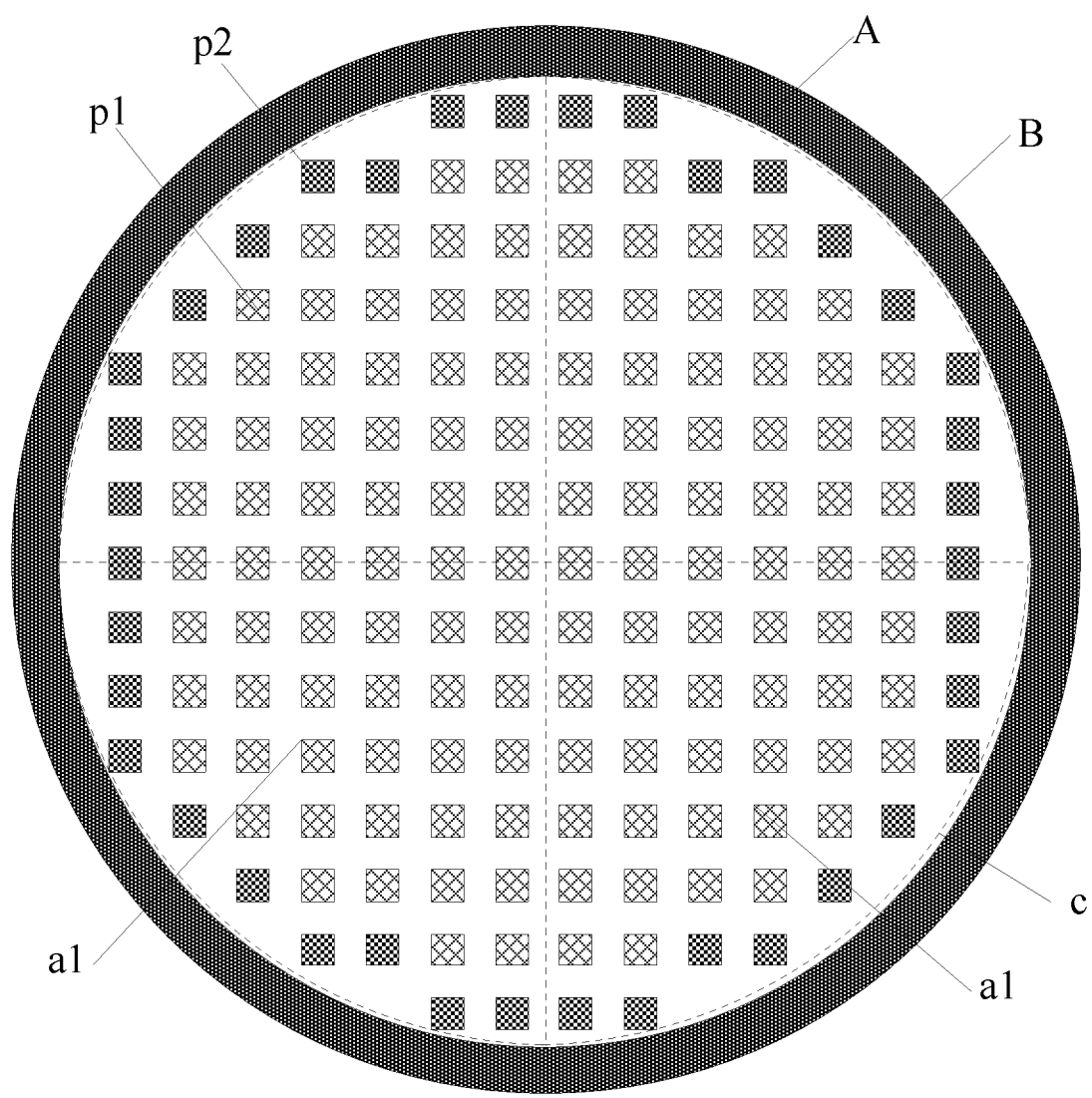
FIG. 6 illustrates a schematic view of another exemplary display panel according to the disclosed embodiments.

FIG. 6 illustrates a schematic view of another exemplary display panel according to the disclosed embodiments. In one embodiment, as shown in FIG. 6, the display region A may only include an irregular-shaped display area, which is a circular display area. The circular display area may be partitioned into four symmetrical display sub-areas a1 in both the pixel row direction and the pixel column direction. As shown in FIG. 6, a portion of the edge of each display sub-area a1 may be an arc c as shown in FIG. 5. The maximum display brightness of the pixels corresponding to the arc c may transition in the same way as illustrated in FIG. 5. The contour of the circular display area may be partitioned into four arc c sections. The pixels in each arc c section may be configured in the same way as the pixels shown in FIG. 5 to facilitate the maximum display brightness transition. The transition of the maximum display brightness of the pixels in each of the two display sub-areas a1 partitioned in the horizontal direction may be configured symmetrically. Similarly, the transition of the maximum display brightness of the pixels in each of the two display sub-areas a1 partitioned in the vertical direction may be configured symmetrically. The transition of the maximum display brightness of the pixels at each arc c section may refer to the description of the embodiments for FIG. 5.

Figure 7:
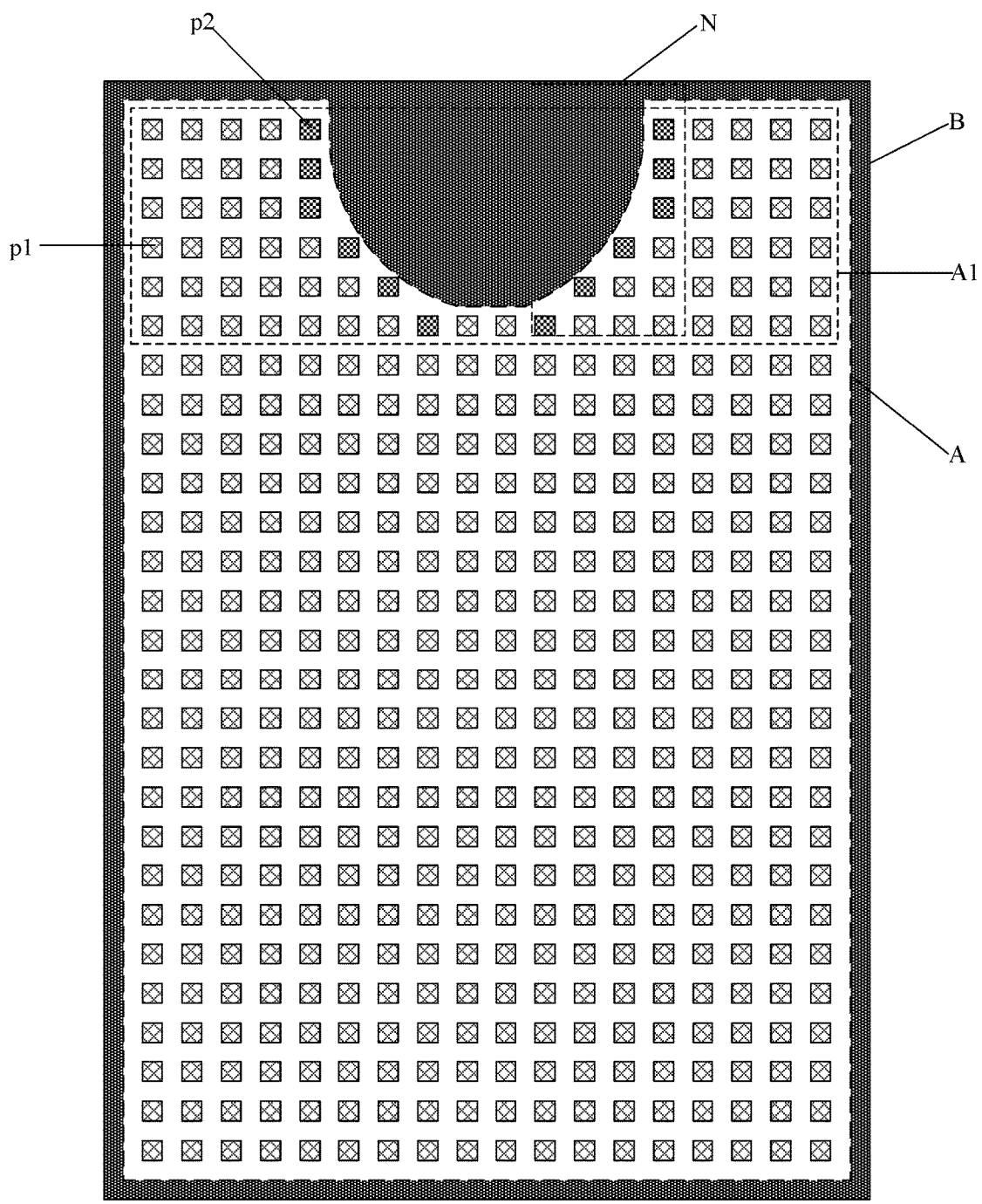
FIG. 7 illustrates a schematic view of another exemplary display panel according to the disclosed embodiments.
Figure 8:
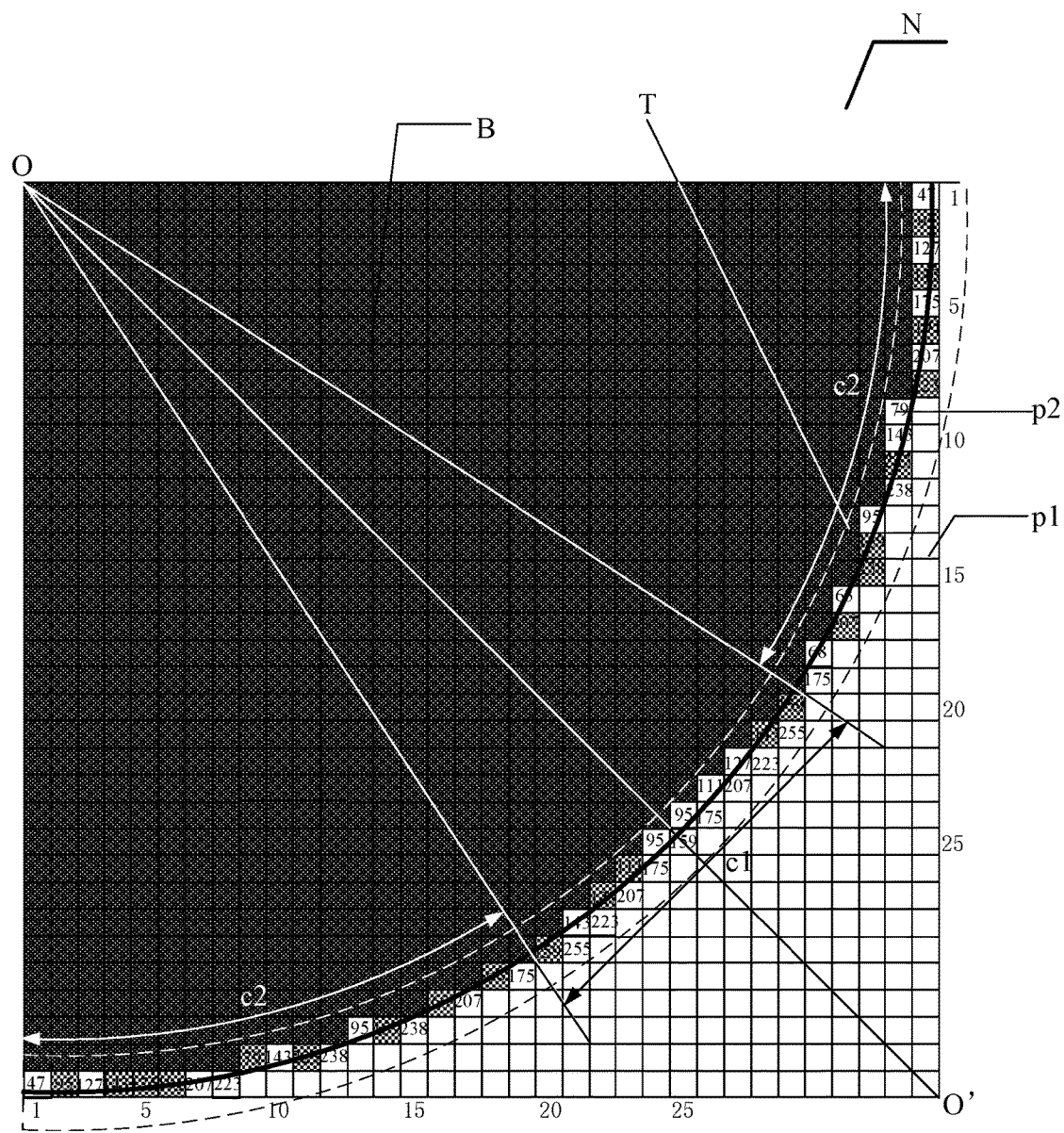
FIG. 8 illustrates a partially enlarged view of an N region in FIG. 7.

FIG. 7 illustrates a schematic view of another exemplary display panel according to the disclosed embodiments. In one embodiment, as shown in FIG. 7, the contour of a portion of the edge of the irregular-shaped display area A1 may be an arc that recesses inward into the display region. The inward recessed arc region may be called N region. FIG. 8 illustrates a partially enlarged view of an N region in FIG. 7. As shown in FIG. 8, the black portion may represent the non-display region B, the grid-filled squares may represent the misaligned pixels p2, and the white unfilled squares may represent the pixels having the maximum display brightness A. The number marked in the pixel square may represent the grayscale number (e.g., 256 grayscale levels, denoted by 0 to 255, where grayscale 255 corresponds to the display brightness A) corresponding to the maximum display brightness of the pixel indicated by the pixel square.

For example, the number 95 marked in the pixel square may represent the display brightness of the pixel in the grayscale 95, which corresponds to the maximum display brightness 96 A/256. The number 143 marked in the pixel square may represent the display brightness of the pixel in the grayscale 143, which corresponds to the maximum display brightness 144 A/256. And so on so forth. In the disclosed embodiments, the number marked in the pixel square may represent the maximum display brightness of the pixel (i.e., the grayscale number).

In one embodiment, as shown in FIG. 8, the contour of the irregular-shaped display area A1 may be an arc c. The arc c may be a symmetrical shape in the transition area T (with respect to the symmetry axis OO'). The arc c may include one center portion c1 and two side portions c2. The center portion c1 may be disposed between the two side portions c2. The center portion c1 may be symmetrical with respect to the symmetry axis OO'. Further, any two adjacent pixel rows and any two adjacent pixel columns corresponding to the center portion c1 may be misaligned by two or less misaligned pixels p2. The maximum display brightness of the misaligned pixels p2 arranged along the center portion c1 of the arc c may gradually increase when moving away from the symmetry axis OO'.

As shown in FIG. 8, in the transition area T corresponding to the center portion c1, the maximum display brightness of the outer side misaligned pixels p2 adjacent to the non-display region B may gradually increase when moving away from the symmetry axis OO'. The grayscale number corresponding to the maximum display brightness of the misaligned pixel intersecting the symmetry axis OO' may be 95. The grayscale numbers corresponding to the maximum display brightness of the misaligned pixels p2 moving away from the center pixel may be 111, 127, 143, and 159, respectively. The maximum display brightness of the inner side misaligned pixels p2 adjacent to the outer side misaligned pixels may be configured in the same way. For example, the grayscale numbers corresponding to the maximum display brightness of the two pixels closest to the symmetry axis OO' may be 159. When moving away from the symmetry axis OO', the grayscale numbers corresponding to the maximum display brightness of the pixels may be 175, 207, 223, and 255, respectively. The maximum display brightness of the inner side pixels may be greater than the maximum display brightness of the corresponding outer side pixels.

The pixels disposed in the center portion c1 may often be the misaligned pixels between the adjacent pixel rows and between the adjacent pixel columns. Human eyes may be sensitive to the difference between the display brightness of the misaligned pixels arranged in a staircase shape at the arc edge and the display brightness of the non-display region B. In one embodiment, to suppress the jagged effect at the arc edge, and in the meantime, to facilitate the overall trend that the maximum display brightness of the pixels in the pixel row and the pixel column may gradually increase in the direction moving away from the non-display region B, the maximum display brightness of the pixels in the center portion c1 may gradually decrease from the center to both sides. Thus, the jagged effect at the edge may be suppressed, and the displaying effect may be more natural.

Figure 9:
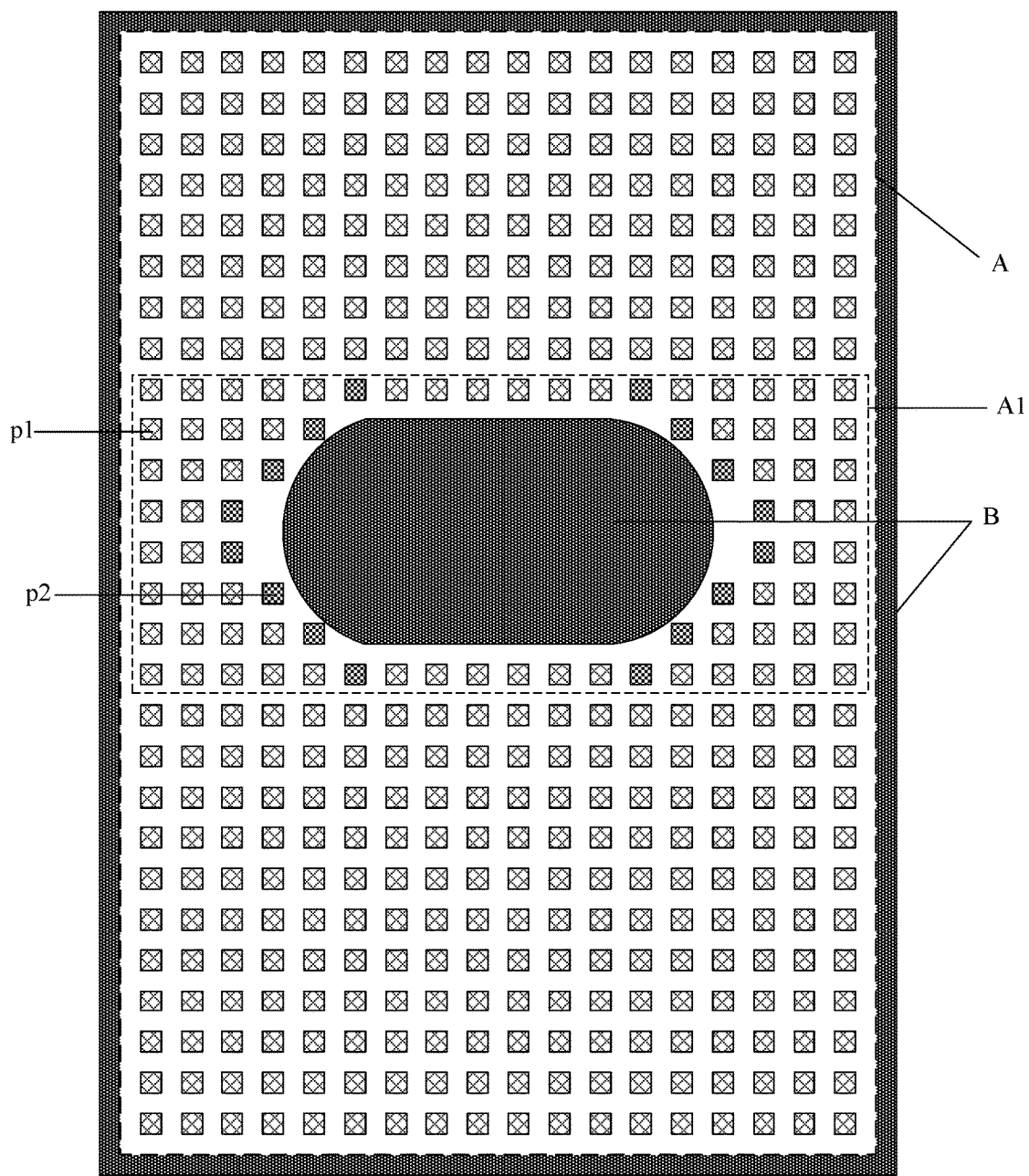
FIG. 9 illustrates a schematic view of another exemplary display panel according to the disclosed embodiments.

FIG. 9 illustrates a schematic view of another exemplary display panel according to the disclosed embodiments. In one embodiment, as shown in FIG. 9, a portion of non-display region B may be disposed inside the irregular-shaped display area A1. In the practical application scenarios, a slit or a hole may be formed inside the irregular-shaped display panel. When the irregular-shaped display area is configured inside the display region, the same display brightness transition method may be applied to the pixels at the irregular edge to suppress the jagged effect in the periphery of the irregular-shaped display area.

In one embodiment, as shown in FIG. 9, the non-display region B disposed inside the irregular-shaped display area A1 may include an arc that protrudes toward the irregular-shaped display area A1. As shown in FIG. 9, the arc edges that protrude toward the irregular-shaped display area A1 may be disposed on both the right side and the left side of the inner non-display region. Thus, the pixels at both arc edges may be arranged with indentation, thereby causing misaligned pixels p2. In one embodiment, the left side and right side arc sections may be partitioned into a center portion and two side portions. The maximum display brightness of the pixels in the center portion and the two side portions may be adjusted to suppress the jagged effect at the arc edges.

Figure 10:
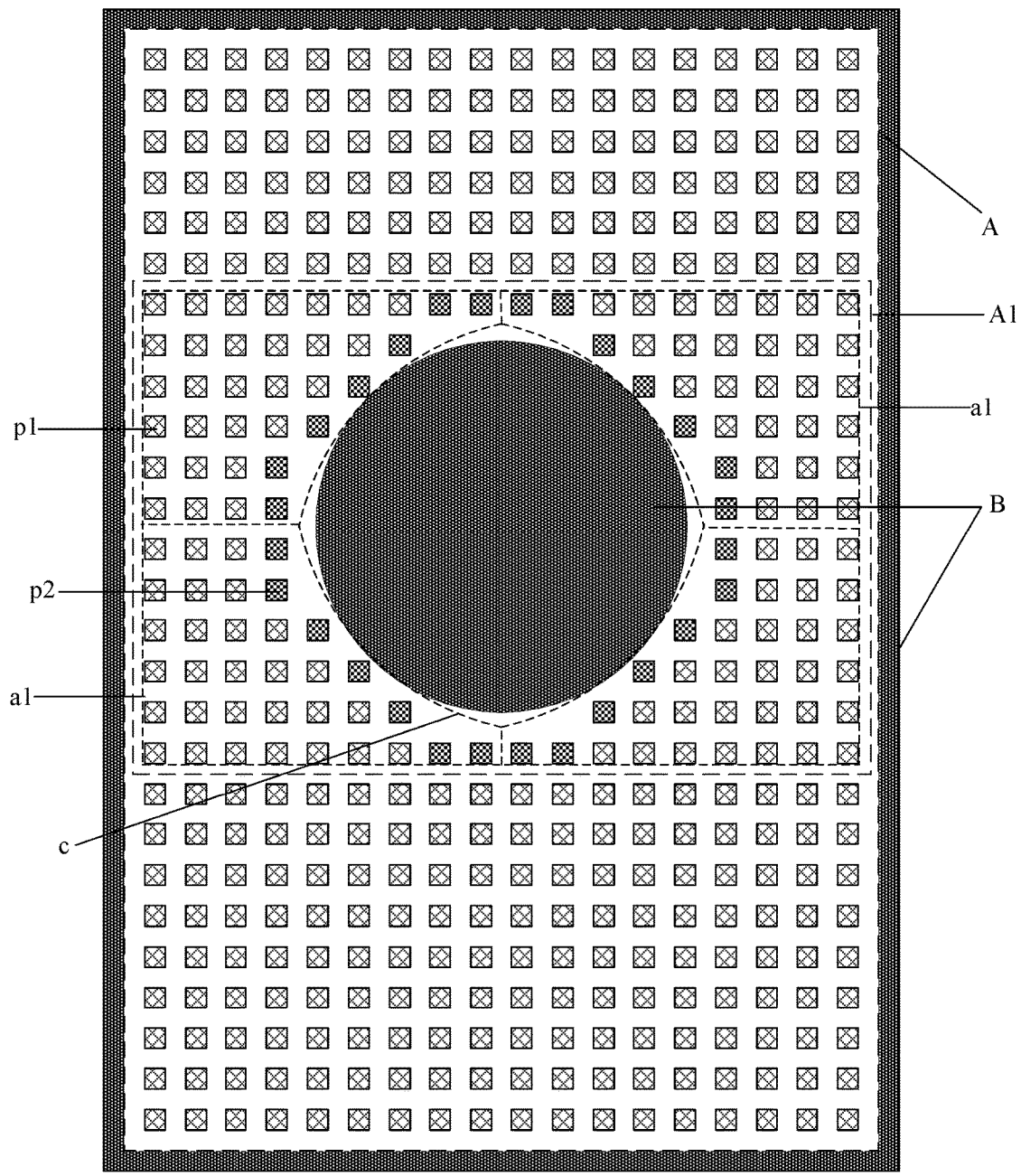
FIG. 10 illustrates a schematic view of another exemplary display panel according to the disclosed embodiments.

FIG. 10 illustrates a schematic view of another exemplary display panel according to the disclosed embodiments. In one embodiment, as shown in FIG. 10, a circular inner non-display region may be disposed inside the irregular-shaped display area A1. The irregular-shaped display area A1 may be partitioned into four mutually symmetrical display sub-areas a1 in the pixel row direction and the pixel column direction. The contour of a portion of the edge of each display sub-area a1 may be an arc c, which is same as the arc section shown in FIG. 8.

The maximum display brightness of the pixels corresponding to the arc c may transition in the same way as illustrated in FIG. 8. The contour of the circular display area may be partitioned into four arc c sections. The pixels in each arc c section may be configured in the same way as the pixels shown in FIG. 8 to facilitate the maximum display brightness transition. The transition of the maximum display brightness of the pixels in each of the two display sub-areas a1 partitioned in the horizontal direction may be configured symmetrically. Similarly, the transition of the maximum display brightness of the pixels in each of the two display sub-areas a1 partitioned in the vertical direction may be configured symmetrically. The transition of the maximum display brightness of the pixels at each arc c section may refer to the description of the embodiments for FIG. 8.

In one embodiment, the same section partition rule for the pixels corresponding to the arc c section in FIG. 5 and FIG. 8 may be applied to the pixels corresponding to the arc c section in FIG. 10. The center portion c1 of the arc c may correspond to the first transition sub-area T1. The two side portions c2 may correspond to the second transition sub-area T2 and the third transition sub-area T3, respectively. The maximum display brightness of the pixels corresponding to the center portion c1 may be configured to transition in the same way as illustrated in FIG. 5 and FIG. 8. The maximum display brightness of the pixels in the pixel rows and the pixel columns corresponding to the two side portions c2 may gradually increase in the direction moving away from the non-display region. Thus, the display brightness may transition from bright to dark in a direction from the normal display area to the irregular edge to further suppress the jagged effect at the edge.

In one embodiment, the curvature of the arc may determine the number of pixels that are indented between adjacent pixel rows and between adjacent pixel columns corresponding to the arc. For example, the curvature of the arc may be inversely related to the radius of the circle corresponding to the arc. On one hand, when the curvature of the arc is substantially small, the radius of the circle corresponding to the arc may be substantially large. At the same time, the arc may occupy a substantially large portion of the irregular-shaped display area, the arc may curve gradually, and the number of the pixels that are indented between adjacent pixel rows and between adjacent pixel columns corresponding to the arc may be substantially small. In this case, the maximum display brightness difference between two adjacent misaligned pixels may be configured to be substantially small. Thus, the display brightness may gradually change across a substantially large transition area to have a natural display effect at the irregular edge.

On the other hand, when the curvature of the arc is substantially large, the radius of the circle corresponding to the arc may be substantially small. At the same time, the arc may occupy a substantially small portion of the irregular-shaped display area, the arc may curve substantially, and the number of the pixels that are indented between adjacent pixel rows and between adjacent pixel columns corresponding to the arc may be substantially large. In this case, to facilitate a smooth display brightness transition between the misaligned pixels, more display brightness levels may be configured for a plurality of adjacent misaligned pixels to reduce the contrast ratio caused by abrupt brightness change between any two adjacent pixels.

Figure 11:
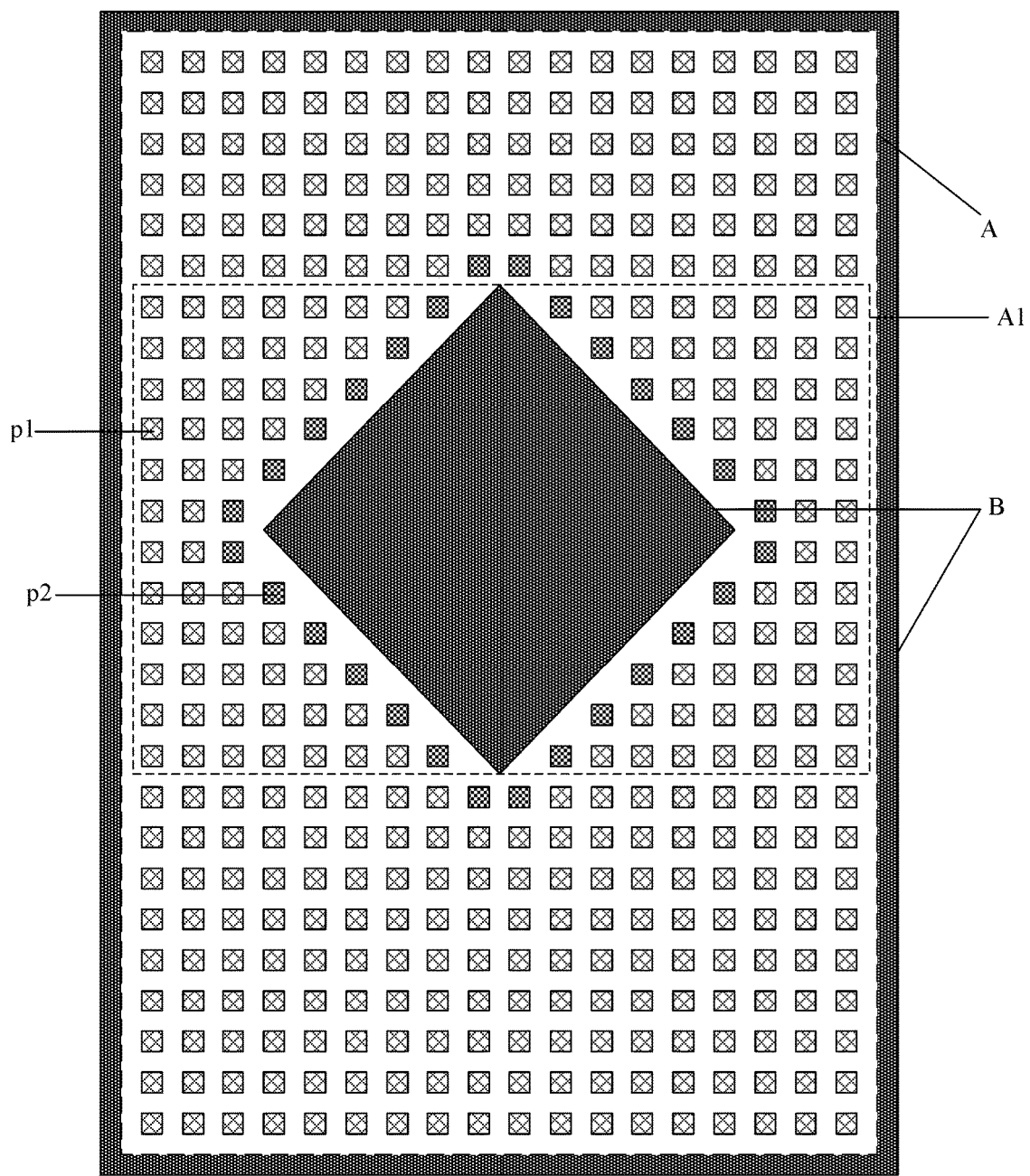
FIG. 11 illustrates a schematic view of another exemplary display panel according to the disclosed embodiments.

FIG. 11 illustrates a schematic view of another exemplary display panel according to the disclosed embodiments. In one embodiment, as shown in FIG. 11, a portion of the non-display region may be disposed inside the irregular-shaped display area A1. The edge of the portion of the non-display region may include straight-line sections that are parallel to neither the pixel row direction nor the pixel column direction. The pixels at the edge of the irregular-shaped display area adjacent to the inner non-display region may be arranged in a plurality of straight-line sections. Each straight-line section may include a plurality of misaligned pixels p2. To suppress the jagged effect by the misaligned pixels at the edge, the maximum display brightness of the misaligned pixels on the straight-line section may be configured for display brightness transition. The pixel configurations for the display brightness transition may refer to the disclosed embodiments corresponding to FIGS. 4C-4E.

In the practical application scenarios, various irregular-shaped edges may be combined. For example, the edge of the irregular-shaped display area may include straight-line sections that are parallel to neither the pixel row direction nor the pixel column direction, and round corners at the corners.

Figure 12:
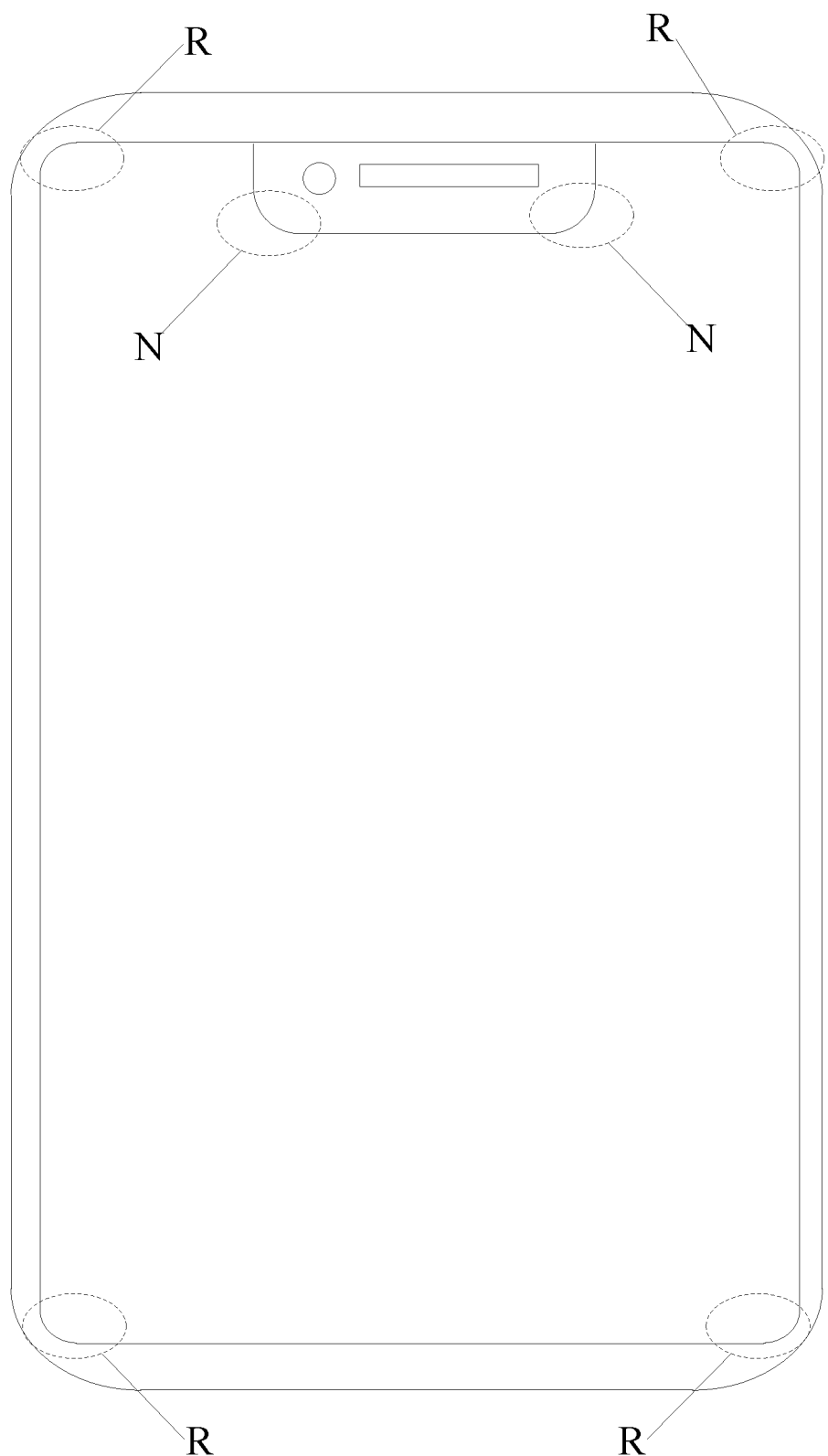
FIG. 12 illustrates a schematic view of another exemplary display panel according to the disclosed embodiments.
Figure 13:
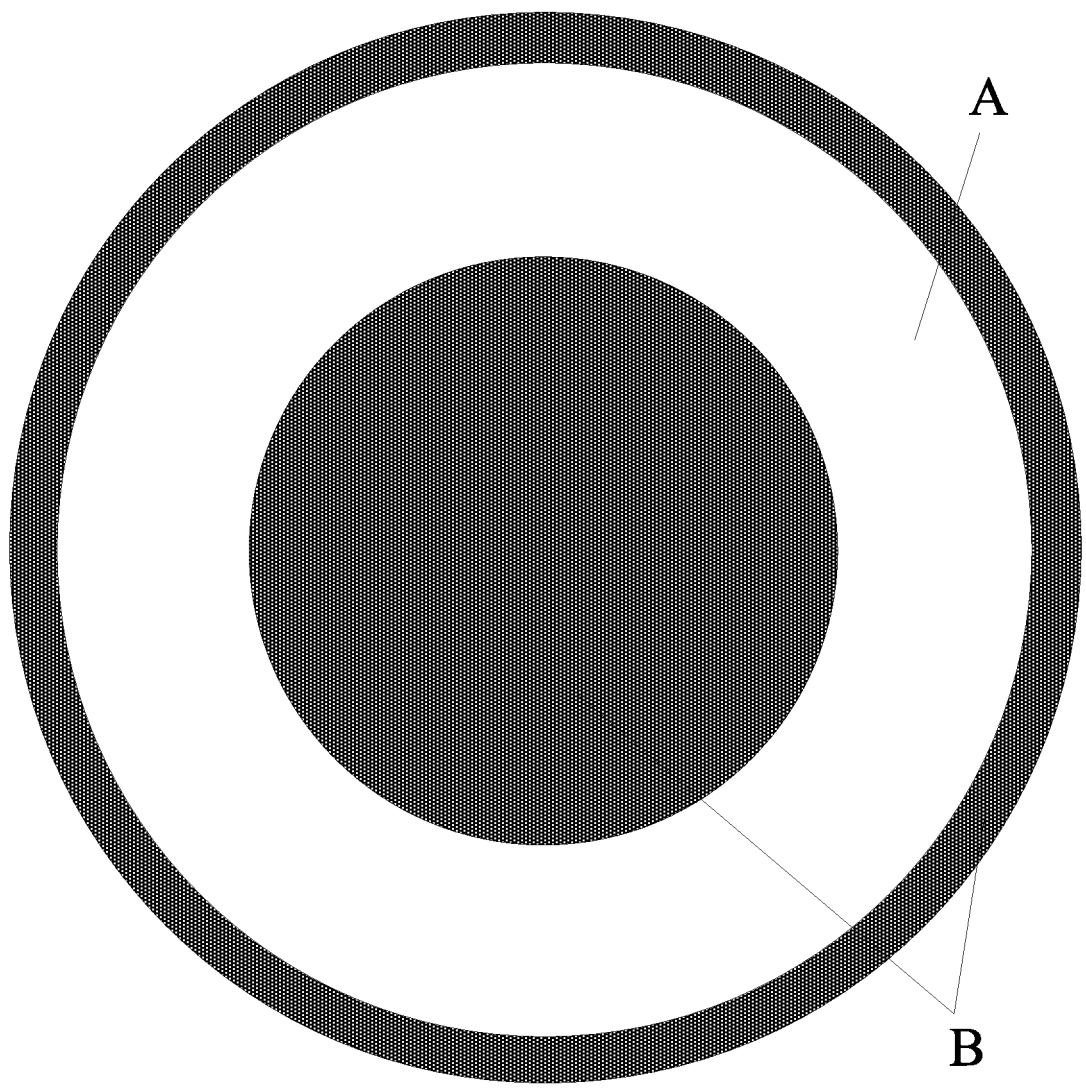
FIG. 13 illustrates a schematic view of another exemplary display panel according to the disclosed embodiments.

FIG. 12 illustrates a schematic view of another exemplary display panel according to the disclosed embodiments. As shown in FIG. 12, the irregular edges may include outward protruding arcs R and inward recessing arcs N. FIG. 13 illustrates a schematic view of another exemplary display panel according to the disclosed embodiments. As shown in FIG. 13, the display panel may include a ring-shaped display region A, an inner non-display region B, and an outer non-display region B. In the practical application scenarios, the display panel may be in other irregular shapes.

No matter what the irregular-shaped display area looks like, as long as pixels are misaligned at the irregular edge, the jagged effect may appear at the irregular edge. Depending on the type of the irregular edge of the display panel, various pixel configuration methods for smooth display brightness transition may be applied to the pixels at various irregular edges to suppress the jagged effect at the irregular edge of the display panel, and to improve the user experience.

The present disclosure also provides a display apparatus, comprising any one of the disclosed display panels. The display apparatus may be a liquid crystal display apparatus, a liquid crystal display panel, a liquid crystal television set, an organic light-emitting diode (OLED) display panel, an OLED display apparatus, an OLED television set, a smart phone, a tablet computer, a laptop computer, or other portable equipment having display function.

Figure 14:
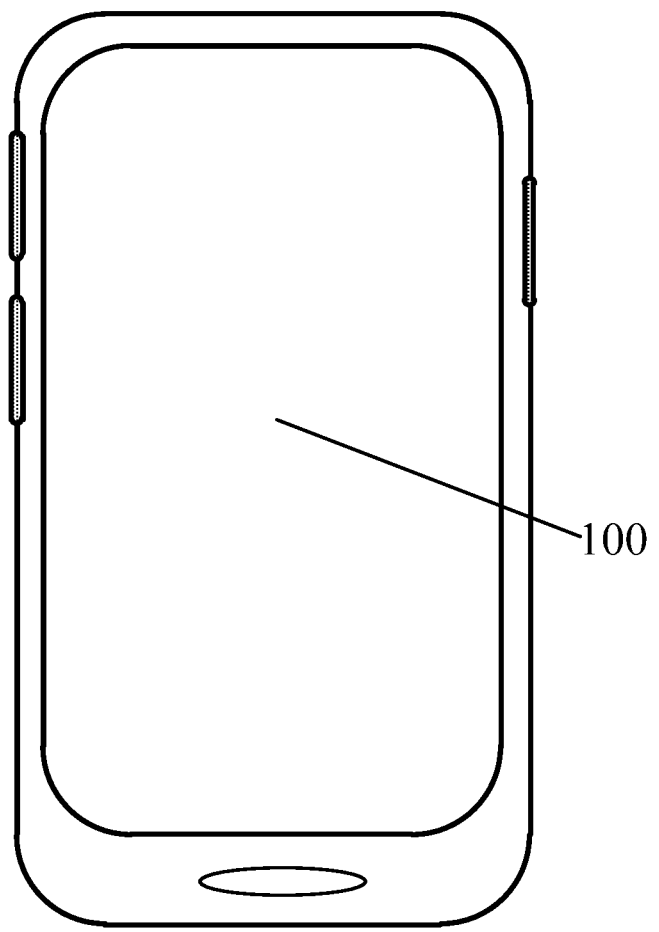
FIG. 14 illustrates a schematic view of an exemplary display apparatus according to the disclosed embodiments.

FIG. 14 illustrates a schematic view of an exemplary display apparatus according to the disclosed embodiments. As shown in FIG. 14, the display apparatus may include a display panel 100. The display panel may be any one of the disclosed display panels. The smart phone in FIG. 14 is intended for illustrative purposes, and is not intended to limit the scope of the present disclosure. Because the display apparatus includes the disclosed display panel, the display apparatus may have the same features and functions of the disclosed display panel.

A display panel and a display apparatus are provided by the present disclosure. The display panel may include a display region and a non-display region disposed adjacent to the display region. The display region may include an irregular-shaped display area. The irregular-shaped display area may include a plurality of pixel arranged in an array. The adjacent pixel rows and/or adjacent pixel columns may be indented or misaligned by at least one pixel at the irregular edge of the irregular-shaped display area. The at least one indented pixel between adjacent pixel rows and/or between adjacent pixel columns may be called misaligned pixel. The irregular-shaped display area may include a transition area that at least includes the misaligned pixels. The maximum display brightness of the pixels inside the transition area may be smaller than the maximum display brightness of the pixels outside the transition area.

Through configuring the transition area in the periphery of the irregular-shaped display area and configuring the maximum display brightness in the transition area to be smaller than the maximum display brightness in the normal display area, the contrast ratio between the irregular edge and the adjacent non-display region may be reduced. Thus, when being viewed by human eyes, the display brightness may gradually decrease from the normal display area to the irregular edge to the adjacent non-display region, the visual perception of the contrast ratio at the irregular edge may be reduced, the jagged effect at the irregular edge of the display panel may be suppressed, and the user experience may be improved.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display panel, comprising:
   a display region including an irregular-shaped display area; and
   a non-display region adjacent to the display region, wherein:
   the irregular-shaped display area includes a plurality of pixels arranged in an array;
   adjacent pixel rows and/or adjacent pixel columns are indented by at least one pixel at a periphery of the irregular-shaped display area;
   the at least one indented pixel between the adjacent pixel rows and/or the at least one indented pixel between the adjacent pixel columns is a misaligned pixel;
   the irregular-shaped display area includes a transition area, and the transition area at least includes a plurality of misaligned pixels that are indented between the adjacent pixel rows and/or the adjacent pixel columns;
   a maximum display brightness of a pixel disposed in the transition area is smaller than a maximum display brightness of a pixel disposed outside the transition area;
   the transition area includes a first transition sub-area, a second transition sub-area, and a third transition sub-area;
   a number of the misaligned pixels in each of a pixel row direction and a pixel column direction in the first transition sub-area is at most two;

a number of the misaligned pixels in each of a pixel row direction and a pixel column direction in the second transition sub-area is at least two;

a number of the misaligned pixels in each of a pixel row direction and a pixel column direction in the third transition sub-area is at least two;

the second transition sub-area and the third transition sub-area include only the misaligned pixels; and the first transition sub-area includes the misaligned pixels and an adjacent pixel in a same pixel row or a same pixel column as the misaligned pixels.

2. The display panel according to claim 1, wherein:
in the transition area, the maximum display brightness of the pixels in a same pixel row gradually increases in a direction moving away from the non-display region; and in the transition area, the maximum display brightness of the pixels in a same pixel column gradually increases in the direction moving away from the non-display region.

3. The display panel according to claim 1, wherein:
the second transition sub-area at least includes a first pixel row and a second pixel row;

in the second transition sub-area, the number of the misaligned pixels in the first pixel row is smaller than the number of the misaligned pixels in the second pixel row; and a maximum display brightness difference between two adjacent misaligned pixels in the first pixel row is greater than a maximum display brightness difference between two adjacent misaligned pixels in the second pixel row.

4. The display panel according to claim 3, wherein:
the maximum display brightness difference between any two adjacent misaligned pixels in the second pixel row is equal.

5. The display panel according to claim 1, wherein:
the third transition sub-area at least includes a first pixel column and a second pixel column;

in the third transition sub-area, the number of the misaligned pixels in the first pixel column is smaller than the number of the misaligned pixels in the second pixel column; and a maximum display brightness difference between two adjacent misaligned pixels in the first pixel column is greater than a maximum display brightness difference between two adjacent misaligned pixels in the second pixel column.

6. The display panel according to claim 5, wherein:
the maximum display brightness difference between any two adjacent misaligned pixels in the second pixel column is equal.

7. The display panel according to claim 1, wherein:
a portion of a contour edge of the irregular-shaped display area is a straight-line section parallel to neither a pixel row direction nor a pixel column direction; and in the transition area, any two adjacent pixel rows have an equal number of misaligned pixels and/or any two adjacent pixel columns have an equal number of misaligned pixels.

8. The display panel according to claim 7, wherein:
in the transition area, any two adjacent pixel rows each has one misaligned pixel, and any two adjacent pixel columns each has one misaligned pixel.

9. The display panel according to claim 8, wherein:
a maximum display brightness of the misaligned pixels that are arranged along the straight-line section gradually decreases from a center of the straight-line section to both ends of the straight-line section.

10. The display panel according to claim 9, wherein:
the maximum display brightness of the misaligned pixel at the center of the straight-line section is in a range approximately of 48 A/256 to 149 A/256, where A is the maximum display brightness of the pixel disposed outside the transition area of the irregular-shaped display area.

11. The display panel according to claim 8, wherein:
a maximum display brightness of the misaligned pixels that are arranged along the straight-line section gradually increases from a center of the straight-line section to both ends of the straight-line section.

12. The display panel according to claim 11, wherein:
the maximum display brightness of the misaligned pixel at the center of the straight-line section is in a range approximately of 88 A/256 to 166 A/256, where A is the maximum display brightness of the pixel disposed outside the transition area of the irregular-shaped display area.

13. The display panel according to claim 1, wherein:
a portion of a contour edge of the irregular-shaped display area is an arc section that protrudes towards the non-display region.

14. The display panel according to claim 1, wherein:
a portion of a contour edge of the irregular-shaped display area is an arc section that recesses towards the display region.

15. A display panel, comprising:
a display region including an irregular-shaped display area; and a non-display region adjacent to the display region, wherein:

the irregular-shaped display area includes a plurality of pixels arranged in an array;

adjacent pixel rows and/or adjacent pixel columns are indented by at least one pixel at a periphery of the irregular-shaped display area;

the at least one indented pixel between the adjacent pixel rows and/or the at least one indented pixel between the adjacent pixel columns is a misaligned pixel;

the irregular-shaped display area includes a transition area, and the transition area at least includes a plurality of misaligned pixels that are indented between the adjacent pixel rows and/or the adjacent pixel columns;

a maximum display brightness of a pixel disposed in the transition area is smaller than a maximum display brightness of a pixel disposed outside the transition area;

a portion of a contour edge of the irregular-shaped display area is an arc section that protrudes towards the non-display region;

the arc section is symmetrical with respect to an internal axis of the transition area;

the arc section includes a center portion and two side portions;

the center portion is disposed between the two side portions;

the center portion is symmetrical with respect to a symmetry axis of the arc section;

the number of the misaligned pixels between any two adjacent pixel rows and between any two pixel columns corresponding to the center portion is at most two; and a maximum display brightness of the misaligned pixels that are arranged along the center portion of the arc section gradually decreases in a direction moving away from the symmetry axis.

16. The display panel according to claim 15, wherein:
the display region includes only the irregular-shaped display area;
the irregular-shaped display area is a circular-shaped display area;
in both a pixel row direction and a pixel column direction, the circular display area is partitioned into four mutually symmetrical display sub-areas; and
a portion of the contour edge of each display sub-area is the arc section.

17. A display panel, comprising:
a display region including an irregular-shaped display area; and
a non-display region adjacent to the display region, wherein:
the irregular-shaped display area includes a plurality of pixels arranged in an array;
adjacent pixel rows and/or adjacent pixel columns are indented by at least one pixel at a periphery of the irregular-shaped display area;
the at least one indented pixel between the adjacent pixel rows and/or the at least one indented pixel between the adjacent pixel columns is a misaligned pixel;
the irregular-shaped display area includes a transition area, and the transition area at least includes a plurality of misaligned pixels that are indented between the adjacent pixel rows and/or the adjacent pixel columns;
a maximum display brightness of a pixel disposed in the transition area is smaller than a maximum display brightness of a pixel disposed outside the transition area;
a portion of a contour edge of the irregular-shaped display area is an arc section that recesses towards the display region;
the arc section is symmetrical with respect to an internal axis of the transition area;
the arc section includes a center portion and two side portions;
the center portion is disposed between the two side portions;
the center portion is symmetrical with respect to a symmetry axis of the arc section;
the number of the misaligned pixels between any two adjacent pixel rows and between any two pixel columns corresponding to the center portion is at most two; and
a maximum display brightness of the misaligned pixels that are arranged along the center portion of the arc section gradually increases in a direction moving away from the symmetry axis.

18. The display panel according to claim 17, wherein:
a portion of the non-display region is disposed inside the irregular-shaped display area.

19. The display panel according to claim 18, wherein:
the portion of the non-display region disposed inside the irregular-shaped display area includes an arc section that protrudes toward the irregular-shaped display area.

20. The display panel according to claim 18, wherein:
the portion of the non-display region disposed inside the irregular-shaped display area has a circular shape;
in both a pixel row direction and a pixel column direction, the irregular-shaped display area is partitioned into four mutually symmetrical display sub-areas; and
a portion of the contour edge of each display sub-area is the arc section.

* * * * *